US006556333B2

(12) United States Patent
Tokuda et al.

(10) Patent No.: US 6,556,333 B2
(45) Date of Patent: Apr. 29, 2003

(54) OPTICAL SCANNER

(75) Inventors: Kazunari Tokuda, Hachioji (JP); Yoshiro Nishimura, Okaya (JP); Masahiro Katashiro, Hachioji (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/915,041

(22) Filed: Jul. 25, 2001

(65) Prior Publication Data

US 2002/0017563 A1 Feb. 14, 2002

(30) Foreign Application Priority Data

Jul. 27, 2000 (JP) ........................................ 2000-227482

(51) Int. Cl.⁷ .............................................. G02B 26/08
(52) U.S. Cl. ...................... 359/224; 359/223; 359/199; 359/198
(58) Field of Search ................................. 359/198, 199, 359/200, 201, 202, 223, 224

(56) References Cited

U.S. PATENT DOCUMENTS 6,232,861 B1 * 5/2001 Asada .......................... 335/222

FOREIGN PATENT DOCUMENTS

| JP | 10-123449 | 5/1998 |
| JP | 2000-258721 | 9/2000 |

* cited by examiner

*Primary Examiner*—James Phan
(74) *Attorney, Agent, or Firm*—Scully, Scott, Murphy & Presser

(57) ABSTRACT

An optical scanner has a coil and a reflection face. This optical scanner also has: a movable plate positioned at its neutral position in a stop state; torsion bars connected to the movable plate; a support body turnably supporting the movable plate by means of the torsion bars; and a restriction member disposed at a position spaced with a predetermined distance from a surface of the movable plate. The restriction member comes into physical contact with the movable plate when a shock is applied to the optical scanner. The restriction member restricts a displacement of the movable plate equal to or greater than a predetermined quantity. The movable plate is turned with the torsion bars being a turning axis.

12 Claims, 11 Drawing Sheets

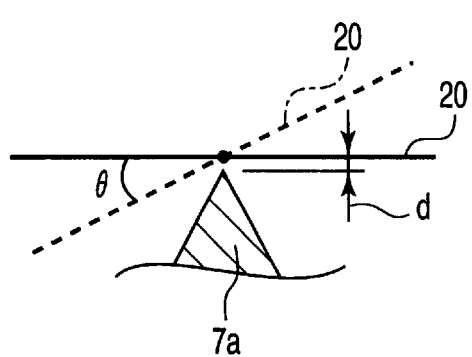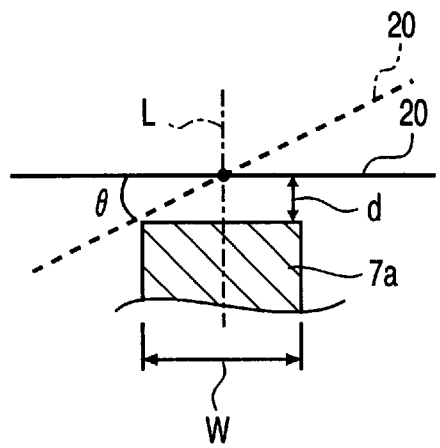
FIG. 2A  FIG. 2B
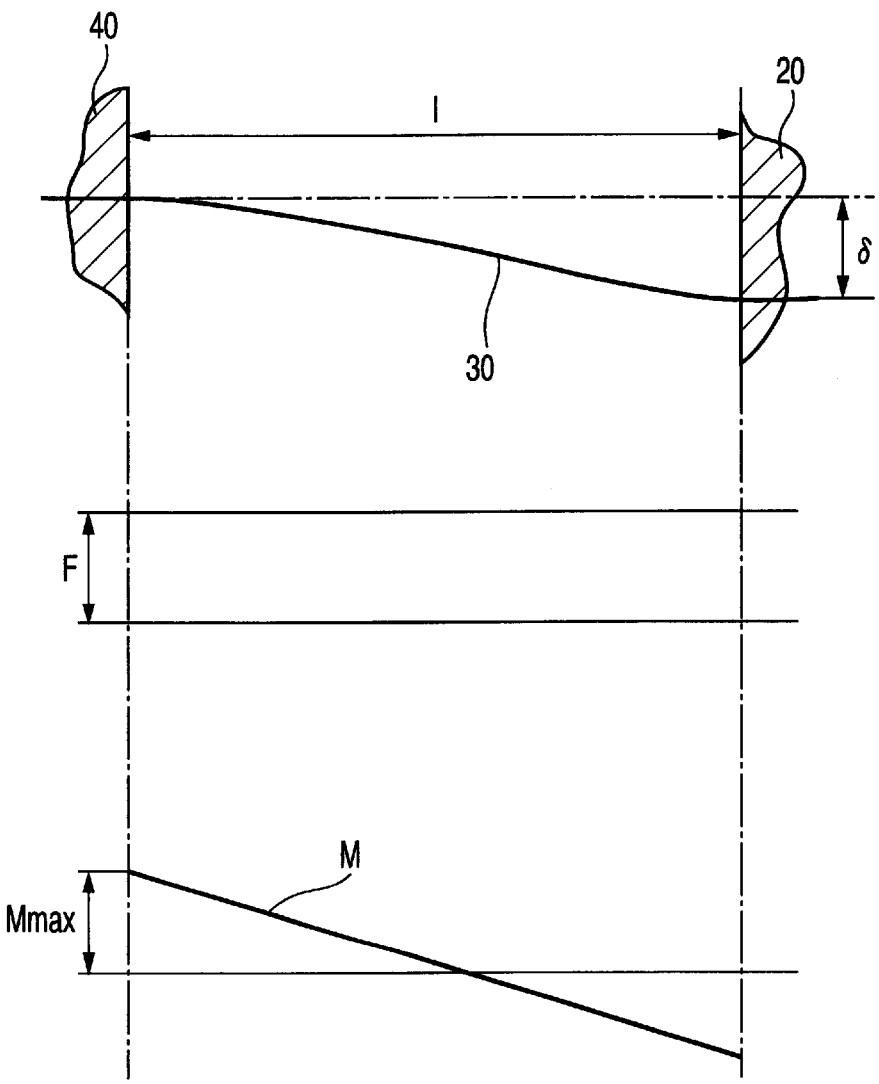
FIG. 4

OPTICAL SCANNER

CROSS-REFERENCE TO RELATED APPLICATION

This application is based upon and claims the benefit of priority from the prior Japanese Patent Application No. 2000-227482, filed Jul. 27, 2000; the entire content of which is incorporated herein by reference.

BACKGROUND OF THE INVENTION

The present invention relates to an optical scanner of a type having a movable plate supported at a support body by means of torsion bars, and scanning light by turning the movable plate with the torsion bars being a turning axis.

The optical scanner of such type as described above is widely known in Jpn. Pat. Appln. KOKAI Publication No. 10-123449.

In an optical scanner 1 disclosed in Jpn. Pat. Appln. KOKAI Publication No. 10-123449, as shown in FIG. 12, a movable plate 2, torsion bars 3, and a support body 4 are integrally configured by utilizing a semiconductor process.

The movable plate 2 has a front portion provided with a coil 5 and a back portion having a reflection face. The front portion and back portion are configured in parallel to each other. The movable plate 2 is positioned at a neutral position in a stop state (in a non-driven state). The neutral position denotes a state in which the movable plate 2 is supported so that the front portion of the movable plate 2 and the front portion of the support body 4 (a face at the same side as the front portion of the movable plate 2) are substantially disposed on the same plane.

At this neutral position, the front portion of the pair of torsion bars 3 (a face at the same side as the front portion of the movable plate 2) as well is disposed at the substantially same plane as the front portions of the movable plate 2 and support body 4. In addition, at this neutral position, the mutually longitudinal center axis lines of the pair of torsion bars 3 are kept in a state in which these axis lines coincide with each other.

The torsion bars 3 are configured in the shape of a pair of plates, each of which is connected to the movable plate 2 at one end, and is connected to the support body 4 at the other end. A pair of torsion bars 3 has a longitudinal center axis lines, and is disposed in a straight line manner so that the mutually longitudinal center axis lines coincide with each other. The longitudinal center axis lines do not pass through the gravity of the movable plate at the neutral position.

The support body 4 supports the movable plate 2 so that the plate can be swung by means of the torsion bars 3. In addition, a pair of permanent magnets 6 is fixed to a face at the same side as the front portion of the movable plate 2.

The coil 5 is provided along the outer periphery at the front portion of the movable plate 2. Both ends of the coil 5 are pulled out onto the support body 4 over a pair of the torsion bars 3. One end and the other end of the coil 5 pulled out onto the support body 4 configure a power supply pad 5a. The power supply pad 5a is connected to a power source (not shown).

When a current is applied from the power supply pad 5a to the coil 5, the optical scanner 1 causes the movable plate 2 to swing (turn) with the torsion bars being a turning axis due to the Lorentz force (electromagnetic force) generated by a magnetic field formed by the permanent magnets 6 and the current. That is, the movable plate 2 is such that the longitudinal center axis lines of a pair of torsion bars 3 and the turning center line of the plate itself coincide with each other. The optical scanner 1 causes light to be externally incident to the reflection face of the back portion of the movable plate 2, and the thus incident light is reflected, thereby scanning light.

The above described optical scanner 1 makes the following operation when the scanner is subjected to strong shock due to a drop or is subjected to vibration.

Hereinafter, a force to which torsion bars 3 are subjected when the optical scanner 1 drops and is subjected to shock will be described with reference to FIG. 13.

First, referring now to FIG. 13A, a description is given with respect to a case in which the optical scanner 1 having the movable plate 2 set at the neutral position drops on a horizontal floor face while the back portion of the movable plate 2 is horizontal. In the specification, the drop is defined as a first state drop.

The first state drop denotes a drop in a vertical direction (a drop downward on a paper face) while the back portion of the movable plate 2 is horizontal. Thus, this drop can be referred to as a drop in a direction orthogonal to the back portion.

When the first state drop is carried out, at a moment when the optical scanner 1 collides with the floor face, an inertial force caused by multiplying acceleration due to such drop for the mass of the movable plate 2 is applied to the movable plate 2. At this time, the movable plate 2, as shown in FIG. 13A, is displaced in a direction (downward) orthogonal to the back portion of the movable plate 2. In the case where the inertial force is excessive, a stress equal to or greater than a permissible stress generates with a pair of torsion bars 3. In this case, the torsion bars 3 extend downwardly or are bent, and a permanent deformation generates. Due to this permanent deformation, there is a possibility that a damage or characteristic change generates with the torsion bars 3. In the case where such a damage or characteristic change generates with the torsion bars 3, the optical scanner 1 cannot cause the movable plate 2 to perform desired swinging, and desired optical scanning cannot be performed. That is, the optical scanner 1 is damaged or is changed in characteristics.

In addition, at the first state drop, although the back portion is positioned downwardly, the front portion may be positioned downwardly. In the case where the optical scanner drops when the front portion is positioned downwardly, the scanner is displaced in a direction orthogonal to the front portion. In this case as well, as in the case where the above described back portion is positioned downwardly, the torsion bars 3 extend downwardly or is bent, and there is a possibility that a permanent deformation generates.

In the specification, a displacement of the movable plate in a direction orthogonal to the front portion and/or back portion is defined as an orthogonal displacement.

Now, a description will be given with respect to a drop of the optical scanner at a disposition at which the surfaces (front portion and back portion) of the movable plate 2 are vertical, in the optical scanner 1 having a movable plate 2 set at a neutral position. In the specification, the above described drop is defined as a second state drop.

The second state drops include a second state horizontal drop in a state in which torsion bars 3 are horizontal (more precisely, the longitudinal center axis lines of the torsion bars are horizontal) and a second state vertical drop in a state in which the torsion bars 3 are vertical.

Now, the second state horizontal drop will be described hereinafter.

With respect to the second state horizontal drop, in FIG. 13B, the drop direction is schematically indicated by the arrow F. When the second state horizontal drop is carried out, at a moment when the optical scanner 1 collides with a floor face H, an inertial force is applied to the movable plate 2 as in the first state drop. Here, the gravity of the movable plate 2 does not coincide with the longitudinal center axis lines of the torsion bars 3. Thus, the inertial force acts as a moment relevant to the rotation axis. Therefore, a deformation due to expansion and torsion generates with the torsion bars 3. As indicated by the arrow R shown in FIG. 13B', the movable plate 2 turns around the turning axis with the torsion bars 3 being the turning axis. In the specification, this turning movement is defined as a turning displacement. In the case where the inertial force is excessive, a permanent deformation due to expansion and torsion generates with the torsion bars 3 due to such turning displacement. Thus, there is a possibility that a damage or characteristic change generates with the optical scanner 1.

In addition, in the second state horizontal drop, the movable plate 2 may be displaced differently from the turning displacement described previously. In particular, in a configuration in which the longitudinal center axis lines of the torsion bars 3 pass through the gravity of the movable plate 2 (applicable to any other configuration), the movable plate 2 may be displaced in a direction orthogonal to the longitudinal center axis lines along the front portion and/or back portion, as shown in FIG. 13D. In the specification, this displacement is defined as an axially orthogonal displacement. In the case where the inertial force is excessive, a permanent deformation due to expansion generates with the torsion bars 3 due to this axially orthogonal displacement. Thus, there is a possibility that a damage or characteristic change generates with the optical scanner 1.

Now, the second state vertical drop will be described here.

The second state vertical drop denotes a drop of the optical scanner 1 onto a floor face H while the longitudinal center axis lines of the pair of torsion bars 3 are orthogonal (vertical) to horizontal face. With respect to the second state vertical drop, in FIG. 13C, the drop direction is schematically indicated by the arrow F.

When the second state vertical drop is carried out, at a moment when the optical scanner 1 collides with a floor face H, an inertial force is applied to the movable plate 2 as in the first direction drop. Therefore, a deformation due to expansion and torsion generates with the torsion bars 3. As shown in FIG. 13C', the movable plate 2 is displaced so as to be inclined relevant to the front portion of the support body 4 at a vertical cross section at which its own front portion passes through the turning center line. In the specification, this displacement is defined as an inclined displacement. In the case where the inertial force is excessive, a permanent deformation due to expansion and bending generates with the torsion bars 3 due to this displacement. Thus, there is a possibility that a damage or characteristic change generates with the optical scanner 1.

In addition, in the second state vertical drop, the movable plate 2 may be displaced differently from the inclined displacement described previously. In particular, in a configuration (applicable to any other configuration) in which the longitudinal center axis lines of the torsion bars 3 pass through the gravity of the movable plate 2, the movable plate 2 may be displaced in a direction along the longitudinal center axis lines along the front portion and/or back portion, as shown in FIG. 13E. In the specification, this displacement is defined as an axial displacement. In the case where an inertial force is excessive, a permanent deformation due to expansion or compression generates with the torsion bars 3 due to this axially orthogonal displacement. Thus, there is a possibility that a damage or characteristic change generates with the optical scanner 1.

In the specification, a displacement denotes a change in movement and posture from the neutral position of a movable plate. In addition, the displacement includes a movement such that a linear and curved route is traced and a combination with a change in posture.

BRIEF SUMMARY OF THE INVENTION

As has been described above, if the movable plate 2 is displaced excessively over a predetermined movable region, a plastic deformation or crack generates with the torsion bars 3 in the optical scanner 1. There is a possibility that a damage or characteristic change caused by swinging of the movable plate 2 generates. The present invention has been made in view of the foregoing problem. It is an object of the present invention to provide an optical scanner capable of preventing a damage or characteristic change even if the scanner is subjected to extreme shock or vibration.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2A is an enlarged schematic cross section view showing a tip end of an orthogonal displacement restriction member;

FIG. 2B is an enlarged schematic cross section view showing a tip end of an orthogonal displacement restriction member;

FIG. 4 is a view showing distributions of shearing force and bending moment at each position along the longitudinal center line of a beam when the beam is bent;

FIG. 13B' is a schematic perspective view showing how torsion bars are deformed when a movable plate is displaced to be turned in the conventional scanner shown in FIG. 12;

FIG. 13C' is a schematic cross section view showing how torsion bars are deformed when a movable plate is displaced to be inclined in the conventional optical scanner shown in FIG. 12;

DETAILED DESCRIPTION OF THE INVENTION

Hereinafter, various embodiments of the present invention will be described with reference to FIGS. 1 to 11.

(First Embodiment)
(Configuration)

Figure 1A:
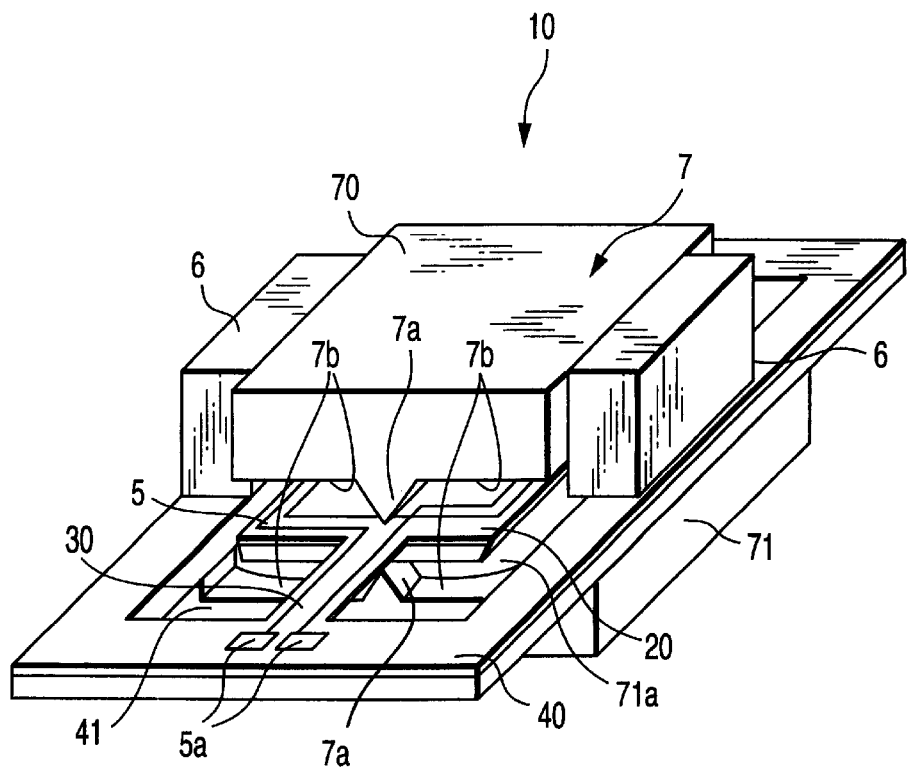
FIG. 1A is a perspective view showing an optical scanner according to a first embodiment of the present invention.
Figure 1B:
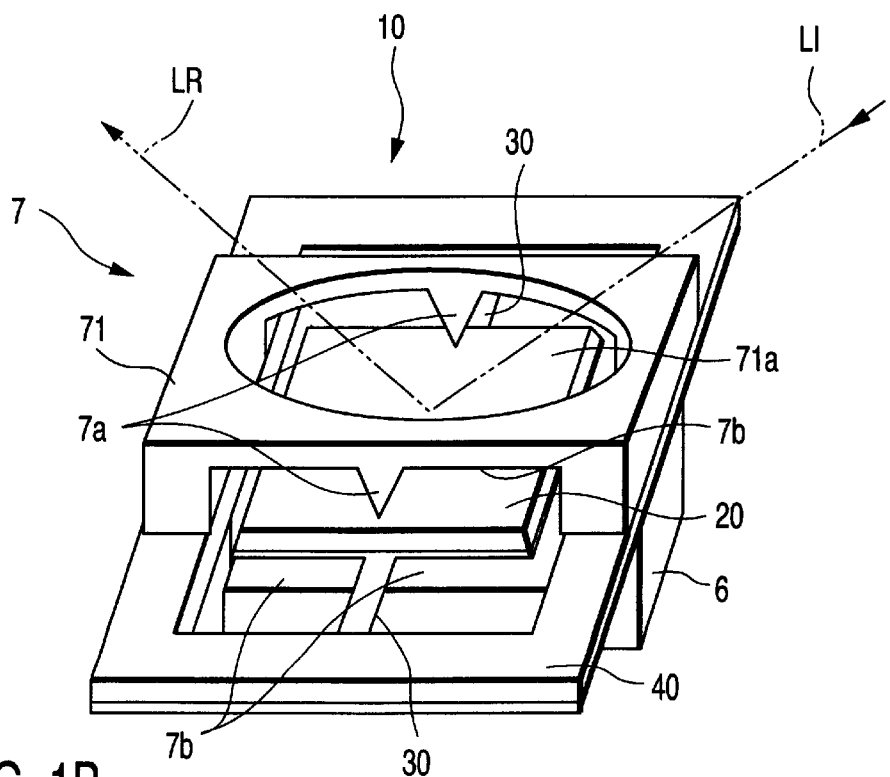
FIG. 1B is a perspective view when the optical scanner shown in FIG. 1A is viewed from an opposite side.

First, an optical scanner 10 according to a first embodiment will be described with reference to FIGS. 1A and 1B. FIG. 1A is a perspective view showing the optical scanner 10 according to the present embodiment. FIG. 1B is a perspective view when the optical scanner 10 shown in FIG. 1A is viewed from an opposite side.

The optical scanner 10 has a movable plate 20, torsion bars 30, a support body 40, and a restriction member 7.

The movable plate 20 is formed in a rectangular shape that has a predetermined thickness. The movable plate 20 has a front portion that has a coil 5, and has a back portion that has a reflection face. The back portion is a face at the opposite side of the front portion. In addition, the front portion and back portion are configured in parallel. The reflection face is made of a metal such as gold or a well-known material that reflects other light. The movable plate 20 is formed in the rectangular-plate shape, and thus, has two sets of two sides, the two sides facing each other. To one of the two sets of two sides, each of torsion bars 30 is connected at the center of each side.

The movable plate 20 is positioned at the neutral position in a stop state. The neutral position is as described in the prior art in the specification. In the present embodiment, the neutral position denotes a state in which the movable plate 20 has a front portion of the movable plate 20 and a front portion of the support body 40 (a face at the same side as the front portion of the movable plate 20) substantially disposed on the same plane. At this neutral position, the front portion of the pair of torsion bars 30 (a face at the same side as the front portion of the movable plate 20) as well is disposed on a plane that is substantially the same as the front portion of the movable plate 20 and support body 40. Each of torsion bars 30 has a longitudinal center axis line. In addition, at this neutral position, the longitudinal center axis lines of a pair of torsion bars 30 are kept so as to coincide with each other.

The shape of the movable plate 20 enables desired swinging. If desired optical scanning can be performed, other shape such as circle, polygon, or any other rectangular shape may be employed in the shape of the movable plate 20.

Each of torsion bars 30 has an elastic member, and is configured in a plate shape. In addition, the torsion bars 30 each are connected to the front portion of the movable plate at one end, and are connected to the front portion of the support body 40 (a face of the support body 40 at the same side as the front portion of the movable plate 20) at the other end. In addition, a pair of torsion bars 30 has a longitudinal center axis lines, and is linearly disposed so that the longitudinal center axis lines coincide with each other. In more detail, each torsion bar 30 is disposed, each of which extends in an orthogonal direction relevant to the connected side of the movable plate 20. Thus, the torsion bars 30 each are disposed at one end and the other end so that its own longitudinal center axis line passes through a geometrical center of the front portion of the movable plate 20. The torsion bars 30 are employed as a turning axis when the movable plate 20 swings. Thus, the longitudinal center axis lines of the torsion bars 30 coincide with the turning centerline of the movable plate 20.

In the present embodiment, the longitudinal center axis lines of the torsion bars extends along a substantial front portion, and thus, does not pass through a center of gravity of the movable plate 20.

However, a pair of torsion bars 30 is connected to the support body 40 so as to swing the movable plate 20, and thus, the connection portions at the movable plate 20 can be arbitrarily selected. For example, the torsion bars 30 can be configured so that its own longitudinal center axis line passes through the center of gravity of the movable plate 20. In this case, in the optical scanner 10 is shocked, the turning movement and inclined displacement hardly generate with the movable plate, which is preferable.

Although the torsion bars 30 are configured in the plate shape in the present embodiment, as long as the movable plate 20 can be swingably supported, any other shape may be employed.

The support body 40 is formed in a frame shape that has an opening 41 capable of housing the movable plate 20 with predetermined intervals. The support body 40 swingably supports the movable plate 20 around a pair of torsion bars 30 in the opening 41 by means of a pair of connected torsion bars 30 as described previously. In addition, the support body 40 has a pair of permanent magnets 6. The pair of permanent magnets 6 is fixed to the front portion of the support body 40, and is disposed so as to face the opening 41 sandwiched between these magnets. In other words, a pair of permanent magnets 6 is provided on the front portion of the support body 40 so as to face two sides of the movable plate 20 that extend in a direction along the longitudinal center axis lines of a pair of torsion bars 30. Although a pair of permanent magnets 6 is disposed as described previously, as long as these magnets can cause the movable plate 20 to perform desired swinging in corporation with the coil 5 on the movable plate 20, the magnets are not limited in disposition.

At a front portion of the movable plate 20, the coil 5 is provided along the outer periphery of the front corporation. Both ends of the coil 5 pass over a pair of torsion bars 30, and are pulled out onto the support body 40. One end and the other end of the coil 5 pulled out onto the support body 40 each configure a power supply pad 5a. A pair of power supply pads 5a composed of one end and the other end of the coil 5 is connected to the power source (not shown). A polyimide film is covered on the surface (front portion) of each of the constituent elements (movable plate 20, torsion bars 30, and support body 40) through which the coil 5 passes. In the present embodiment, as described above, although the polyimide film is covered on the surface of each constituent element through which the coil 5 passes, if desired insulation effect is achieved, any other insulation film may be covered. In addition, although the coil 5 is disposed along the outer periphery of the surface of the movable plate 20, the optical scanner 10 is not limited in the disposition if desired optical scanning can be performed.

The movable plate 20, torsion bars 30, and support body 40 are integrally formed by utilizing a semiconductor manufacturing process, thereby forming a torsion swinging body. However, if the torsion swinging body can cause desired swinging, each of the constituent elements (movable plate 20, torsion bars 30, and support body 40) is separately configured, and then, the torsion swinging body can be formed by being bonded by any well-known bonding means such as adhesive.

The restriction member 7 has a coil side restriction member 70 and a reflection face side restriction member 71.

The coil side restriction member 70 has a substantially rectangular shape, and is disposed between a pair of permanent magnets 6. The coil side restriction member 70 is fixed to the support body 40 via the permanent magnets 6. In more detail, in the coil side restriction member 70, a face orthogonal to the front portion of the support body 40 and extending in a direction along the turning center line of the turning plate 20 (a direction along the longitudinal center axis lines of the torsion bars 30) (hereinafter, referred to as a side face along an axis) is fixed to the pair of permanent magnets 6, and is supported by the support body 40.

In the coil side restriction member 70, a mutual interval between a pair of permanent magnets is determined by fixing a pair of permanent magnets 6 to the side face along the axis as described above. Thus, if the coil side restriction member 70 is fixed to the support body 40 after fixing the permanent magnets 6, as described previously, a relative position of the permanent magnets 6 to the coil 5 can be easily determined.

In addition, on a face of the coil side restriction member 70 facing the movable plate 20 (hereinafter, referred to as a back portion of the coil side restriction member 70), a pair of orthogonal displacement restriction portions 7a is provided at both ends along the turning center line of the movable plate 20. Each of orthogonal displacement restriction portions 7a is a protrusion that vertically protrudes against the movable plate 20. The protrusion is formed in an edge shape at its tip end. In addition, the edge shaped tip end extends along the turning center line of the movable plate. In addition, at the back portion of the coil side restriction member 70, a portion other than an orthogonal displacement restriction portions 7a defines a turning displacement restriction portion 7b.

At the back portion of the coil side restriction member 70, the orthogonal displacement restriction portion 7a is provided at both ends along the turning center line of the movable plate 20. However, a pair of orthogonal displacement restriction portions 7a is integrally formed, whereby the restriction portions can be disposed over the back portion of the coil side turning center line 70 along the turning center line, and can be disposed in plurality with mutual intervals along the turning center line. In addition, although the coil side restriction member 70 is formed in a substantially rectangular shape, the restriction member may be formed of other polygonal column or cylinder and the like, and is not limited in shape.

A reflection face side restriction member 71 is formed in a bridge shape, as shown in FIG. 1B, and is provided at the back portion of the support member 40 so as to be disposed at the opposite side of the coil side restriction member 70 with the movable plate 20 sandwiched between these members.

A front portion of the reflection face side restriction member 71 faces a back portion (reflection face) of the movable plate 20. In addition, the reflection face side restriction member 71 has an opening 71a at its center portion. The opening 71a has its sufficient size so that optical scanner 10 may be desired scanning. The desired scanning is performed by means of light LR reflected by the reflection face without interrupting light LI that is incident to the reflection face of the movable plate 20. In addition, at the front portion of the reflection face side restriction member 71, a pair of orthogonal displacement restriction portions 7a is provided at both ends along the turning center line of the movable plate 20. A pair of orthogonal displacement restriction portions 7a is a protrusion that vertically protrudes toward the movable plate 20. The protrusion is formed in an edge shape at its tip end. In addition, the edge shaped tip end extends along the turning center line of the movable plate. In addition, at the front portion of the reflection face side restriction member 71, a portion other than the orthogonal displacement restriction portion 7a specifies the turning displacement restriction portion 7b.

The reflection face side restriction member 71 is formed in a bridge shape that has a rectangle shaped back portion. However, as long as the restriction member 71 has at least one of the orthogonal displacement restriction portion 7a and turning displacement restriction portion 7b, and has an opening 71a capable of allowing incidence of light to the reflection face of the movable plate 20 and emission of reflection light from the reflection face during optical scanning, this member is not limited in shape.

The orthogonal displacement restriction portion 7a of each of the coil side restriction member 70 and reflection face side restriction member 71 is provided with predetermined intervals between the restriction portion and a corresponding surface of the movable plate 20 (a face of the movable face 20 facing the orthogonal displacement restriction portion 7a) so as not to prevent desired swinging (turning) of the movable plate 20 with a pair of torsion bars 30 being a turning axis.

First, although an interval between a tip end of a protrusion shaped orthogonal displacement restriction portion 7a and a corresponding surface of the movable plate 20 is not limited unless desired swinging (turning) of the movable plate 20 has been prevented, the interval is preferably greater than 0 mm and is equal to or smaller than 0.2 mm. The minimum value of the interval must be greater than 0 mm. This is because an interval of 0 mm denotes that the vertex of the orthogonal displacement restriction portion 7a comes into contact with the corresponding surface of the movable plate 20. Thereby the frictional resistance caused by such contact prevents smooth swinging (turning) of the movable plate 20.

As described above, in order to reduce an interval between the orthogonal displacement restriction portion 7a and a face (front portion and/or back portion) of the movable plate 20 facing the orthogonal displacement restriction portion 7a, a tip end of the orthogonal displacement restriction portion 7a is configured in an edge shape. As in the above configuration, the optical scanner 10 is configured in an edge shape at the tip end. Thus, an interval "d" between the movable plate 20 and the tip end (refer to FIG. 2A) can be reduced as compared with a case in which the tip end is not formed in an edge shape. A center angle "r" of the edge is not limited unless desired swinging (turning) of the movable plate 20 has been prevented. However, in the case where the mechanical swing angle of the movable plate 20 is θ, this center angle is set to be smaller than an angle r' obtained by formula 1 below Angle r' (degrees)=180−2θ    (Formula 1)

In the specification, the aforementioned mechanical swing angle θ indicates an angle formed between a horizontal face that passes through the turning center line of the movable plate 20 and a movable plate 20 when swinging at a maximum in normal swinging of the movable plate 20, as shown in FIG. 2A.

In addition, as described above, the tip end shape of the orthogonal displacement restriction portion 7a can be arbitrarily selected unless desired swinging (turning) of the movable plate 20 has been prevented. For example, as shown in FIG. 2B, the tip end of the orthogonal displacement restriction portion 7a can be configured in a flat plane shape. The thus configured orthogonal displacement restriction portion 7a has a width W in a transverse direction on a paper face, and has a longitudinal center axis line L.

At the above configured orthogonal displacement restriction portion 7a, in the case where its own longitudinal center axis line L passes through the swinging (turning) center of the movable plate 20, and a face of the movable plate 20 at a facing neutral position is parallel to a flat face at the tip end thereof, if an interval "d" is equal to or smaller than a value obtained by formula 2 shown below, the restriction portion may come into contact with the movable plate 20 in normal swinging.

Interval "d"=W/2×tan θ    (Formula 2)

Therefore, in a configuration in which the above tip end is flat, the interval "d" cannot be reduced as compared with a configuration in which the tip end is edge shaped. Therefore, at the tip end of the orthogonal displacement restriction portion 7a, a case in which the tip end is formed in an edge shape can reduce the interval "d" as compared wit a case in which the tip end is flat, and thus, the displacement of the movable plate can be restricted more remarkably. Therefore, the orthogonal displacement restriction portion 7a whose tip end is edge shaped can provide an advantageous effect that, even in the case where an allowable stress of the torsion bar 30 is small, the stress that generates with the torsion bar 30 is restricted to be a predetermined value or less.

In addition, an interval between a turning displacement restriction portion 7b and a corresponding surface of the movable plate 20 is preferably 0.5 mm, although not limited unless desired swinging (turning) of the movable plate 20 has been prevented.

A maximum value of an interval between the above described movable plate 20 and the orthogonal displacement restriction portion 7a and an interval between the plate and the turning displacement restriction portion 7b is not limited unless the stress in the torsion bar 30 that generates as a result of elastic deformation of the torsion bar 30 exceeds an allowable stress.

(Operation)

Now, an operation of an optical scanner 10 according to the above described first embodiment will be described here.

When a driving current is supplied from a power supply pad 5a to a coil 5, the optical scanner 10 generates an electromagnetic force in which the current is a Lorentz force in a magnetic field formed by a permanent magnet 6. In this manner, the movable plate 20 performs swinging (turning) with a pair of torsion bars 30 being a turning axis. This swinging (turning) is generated by an electromagnetic force acting as a so called couple that works in an opposite direction in a place equal in distance from the turning axis. When a alternating current with its frequency that coincides with a specific resonance frequency that is determined depending on the torsion rigidity of the torsion bar 30 and an inertial moment of the movable plate 20 is supplied to the coil 5, the movable plate 20 swings (turns) around the turning axis (torsion bar 30) most efficiently.

The optical scanner 10 according to the present embodiment makes operation described below in the case where the scanner is subjected to an extreme shock caused by a drop or is subjected to vibration.

Figure 13A:
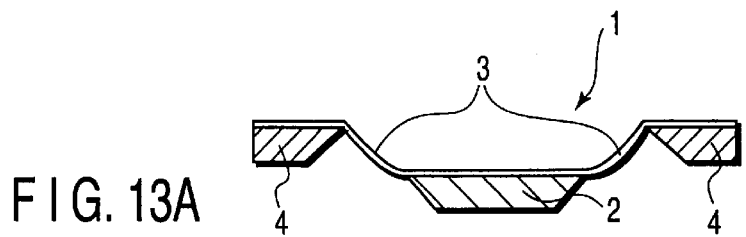
FIG. 13A is a schematic cross section view showing how torsion bars are deformed when the conventional optical scanner shown in FIG. 12 is subjected to a first state drop.

First, a case in which the movable plate 20 is subjected to the orthogonal displacement as shown in FIG. 13A will be described here.

Figure 3A:
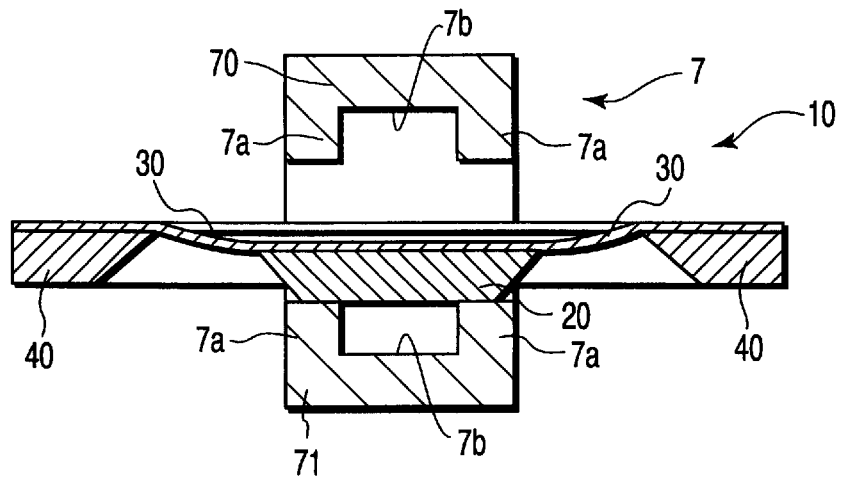
FIG. 3A is a schematic cross section view showing an operation of the restriction member when a movable plate is displaced to be orthogonal in the optical scanner shown in FIG. 1A.

In the case of the orthogonal displacement, the movable plate 20 comes into contact with the orthogonal displacement restriction portion 7a of the reflection face side restriction member 71 positioned downwardly as schematically shown in FIG. 3A. Due to this contact, the movable plate 20 is prevented from being further displaced in a direction orthogonal to its own back portion. Thus, a stress is less than an allowable stress to a pair of torsion bars 30. Thereby the stress does not cause a permanent deformation due to downward expansion of the torsion bar 30 on a paper face.

Figure 13B:
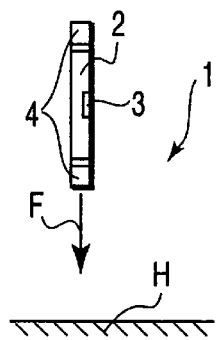
FIG. 13B is a schematic cross section view showing how the conventional optical scanner shown in FIG. 12 is subjected to a second state horizontal drop.
Figure 13B:
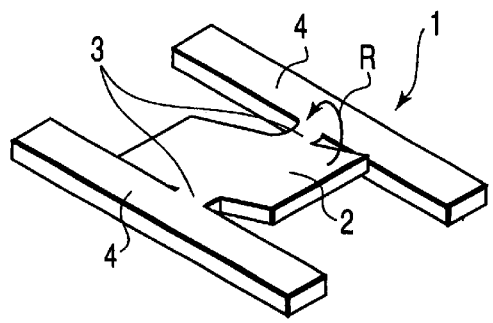

Here, a case in which the movable plate 20 is subjected to the turning displacement as shown in FIG. 13B will be described here.

Figure 3B:
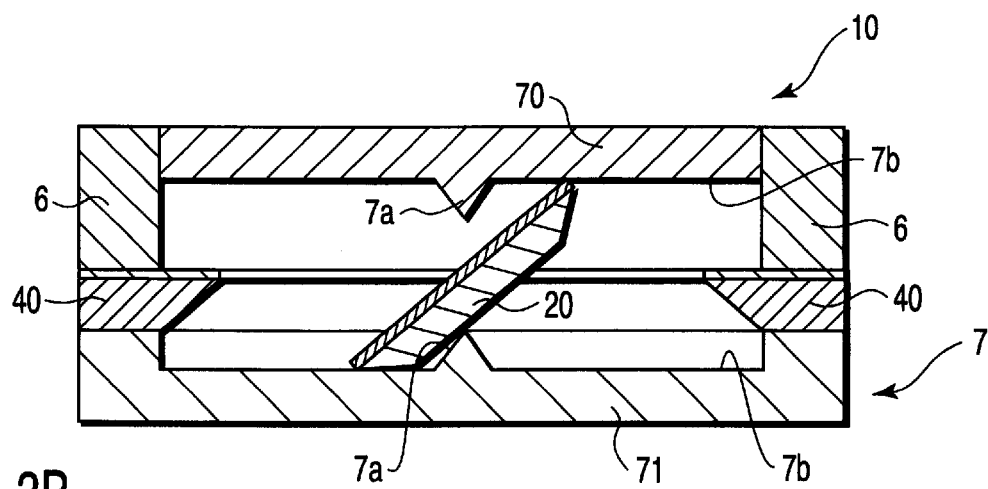
FIG. 3B is a schematic cross section view showing an operation of the restriction member when a movable plate is displaced to be turned in the optical scanner shown in FIG. 1A.

In the case of the turning displacement, as shown in FIG. 3B, the movable plate 20 comes into contact with the turning displacement restriction portion 7b of the coil side restriction member 70 and reflection face side restriction member 71 so that the turning displacement of the movable plate 20 around the turning axis (torsion bars 30) does not exceed a predetermined turning range. Due to this contact, the movable plate 20 is prevented from being displaced beyond a predetermined turning range. Thus, a stress is less than an allowable stress to a pair of torsion bars 30. Thereby the stress does not cause a permanent deformation due to torsion of the torsion bar 30. The torsion bars 30 is prevented from the deformation.

Figure 13C:
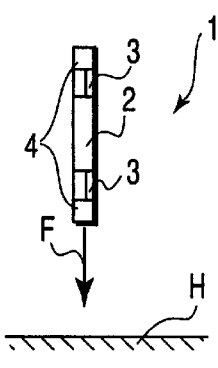
FIG. 13C is a schematic cross section view showing how the conventional scanner shown in FIG. 12 is subjected to a second state vertical drop.
Figure 13C:
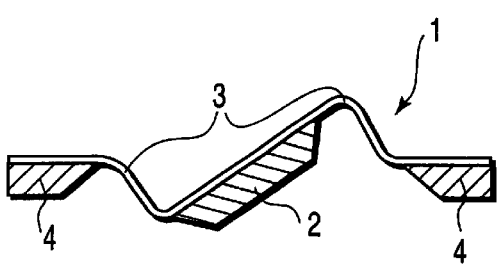

Here, a case in which the movable plate 20 is subjected to the inclined displacement as shown in FIG. 13C will be described here.

In the case of the inclined displacement, the movable plate 20 comes into contact with the orthogonal displacement restriction portion 7a of the coil side restriction member 70 and reflection face side restriction member 71 so that the inclining its own front portion relevant to the support body 40 does not exceeds a predetermined swinging range. Due to this contact, the movable plate 20 is prevented from being further inclined relevant to the turning center line. Thus, a stress is less than an allowable stress to a pair of torsion bars 30. Thereby the stress does not cause a permanent deformation due to expansion of the torsion bar 30. The torsion bars 30 is prevented from the deformation.

In the optical scanner 10 according to the present embodiment, even in the case where the displacement generates multiply, the movable plate 20 comes into contact with the restriction member 7 corresponding to the displacement. Thereby an occurrence of a permanent deformation with the torsion bars 30 can be prevented.

As has been described above, in the optical scanner 10 according to the present embodiment, an occurrence of a permanent deformation with the torsion bars 30 due to an excessive orthogonal displacement, a turning displacement, and an inclined displacement is prevented. Thus, when the optical scanner 10 is used, the optical scanner 10 causes the movable plate 20 to perform desired swinging (turning), and desired optical scanning can be performed.

Here, a stress reduction effect generated in the torsion bar 30 by a displacement of the movable plate 20 being restricted by the restriction member 7 when the movable plate 20 is subjected to an excessive force, as described above, will be described with reference to FIG. 4.

FIG. 4 is a view showing a distribution of shearing forces and bending moments at each position along the longitudinal center line of a beam when the beam is bent.

The torsion bar 30 can be assumed as a beam of length 1 on which both ends are fixed by the support body 40 (left relevant to a paper face) and the movable plate 20 (right relevant to a paper face). Assume that one end of this beam is displaced by δ relevant to an axis line. At this time, a shearing force F and a bending moment M generate with the beam. The shearing force F is constant along the longitudinal center line of this beam, and the amount is determined according to formula 3 below.

$$F = 12EI\delta/1^3 \qquad \text{(Formula 3)}$$

In addition, the bending moment M is maximal at both ends, and the amount is determined according to formula 4 below.

$$M_{max} = 6EI\delta/1^2 \qquad \text{(Formula 3)}$$

In formulas 3 and 4, E denotes a Young modulus of a beam material, and I denotes a moment of inertia of area of the beam.

The stress that generates at each point in a direction along the longitudinal center line of the beam is associated with F, M, and beam sectional shape. If the sectional shape is constant, the smaller F and M are, the smaller stress is. Here, F and M are proportional to a displacement δ at the other end relevant to one end of the beam. Therefore, as the δ value is reduced, the F and M value are reduced, and a stress that generates with the beam is reduced. Therefore, the restriction member 7 that restricts a displacement of the movable plate 20 restricts the δ value.

Here, restricting the δ value in the restriction member 7 is determined depending on an interval between the movable plate 20 and the restriction member 7. As is evident from formulas 3 and 4, smaller displacement of the movable plate 20 is preferable in reducing the stress of the beam. Thus, an interval between the movable plate 20 and the restriction member 7 is selected to be small to an extent such that predetermined swinging (turning) of the movable plate 20 is not prevented due to a contact. The restriction member 7 that restricts a displacement of the movable plate 20 is provided at the optical scanner according to the present invention. Thus, a stress is less than an allowable stress to a pair of torsion bars 30. Thereby the stress does not cause a permanent deformation due to expansion of the torsion bar 30. The torsion bars 30 is prevented from the deformation.

In addition, a Max interval value between the movable plate 20 and the restriction member 7 is depending on the beam length 1 and a moment of inertia of area I (depending on the sectional shape of the beam) or varies depending on an allowable stress of material as can be seen from the formulas 3 and 4. The interval between the movable plate and the restriction member according to the present invention can be arbitrarily selected by changing the material, shape, and size of the torsion bar.

In this way, according to the optical scanner 10 of the present embodiment, even if the scanner 10 is subjected to an extreme shock caused by a drop or is subjected to vibration, the resulting expansion of the torsion bars 30 or displacement of the movable plate 20 causing a torsion can be reduced to the required minimum, and a damage and characteristic change of the optical scanner 10 can be prevented.

(Second Embodiment)

Hereinafter, a configuration of an optical scanner 11 according to a second embodiment of the present invention will be described with reference to FIG. 5 and FIGS. 6A to 6C. Like constituent elements identical to those of the optical scanner 10 according to the first embodiment of the present invention are designated by like reference numerals corresponding to those of the optical scanner 10. A detailed description will be omitted here.

Figure 5:
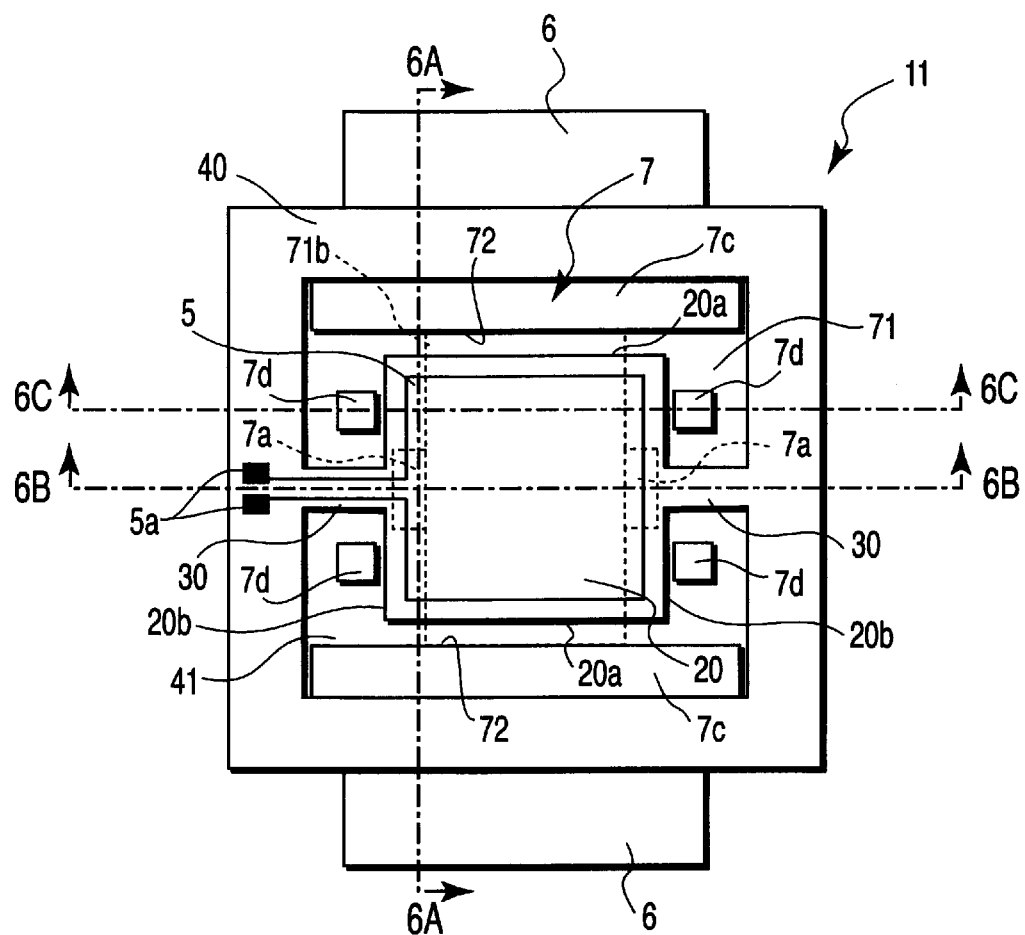
FIG. 5 is a schematic top view of an optical scanner according to a second embodiment of the present invention.
Figure 6A:
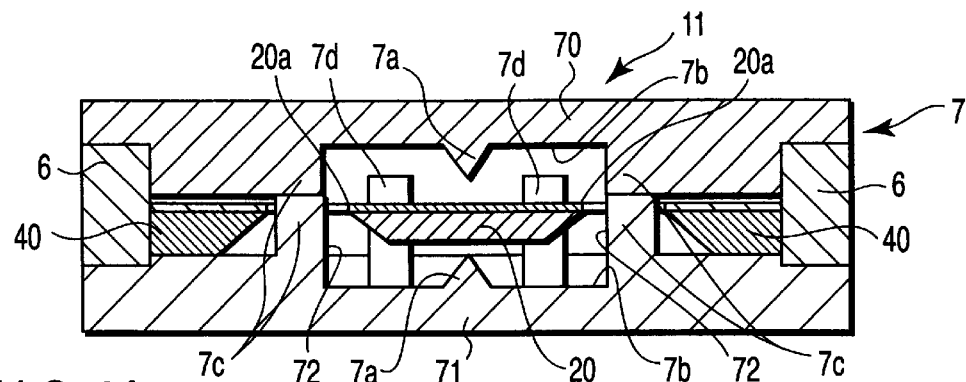
FIG. 6A is a cross section taken along the line A—A shown in FIG. 5.
Figure 6B:
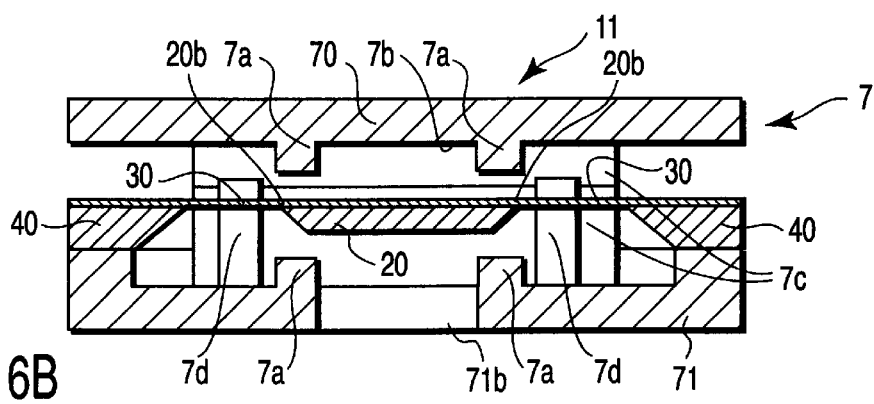
FIG. 6B is a cross section taken along the line B—B shown in FIG. 5.
Figure 6C:
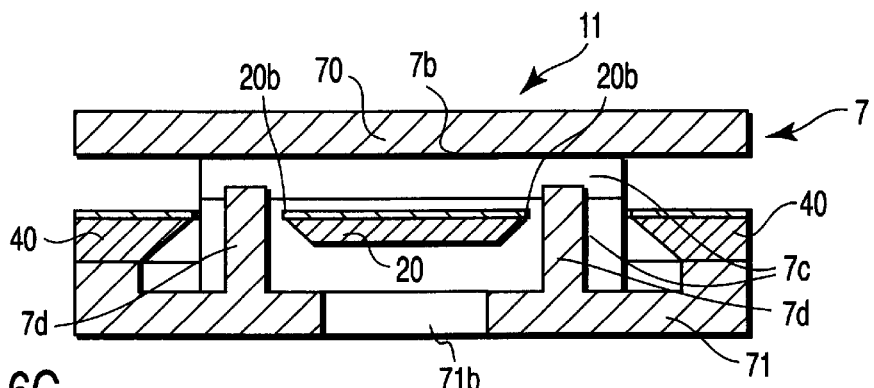
FIG. 6C is a cross section taken along the line C—C shown in FIG. 5.

FIG. 5 is a schematic top view of the optical scanner 11, where a coil side restriction member 70 is not shown for clarity. FIG. 6A is a sectional view of the optical scanner 11 taken along line A—A shown in FIG. 5. FIG. 6B is a sectional view of the optical scanner 11 taken along line B—B shown in FIG. 5. FIG. 6C is a sectional view of the optical scanner 11 taken along line C—C shown in FIG. 5.

Figure 13D:
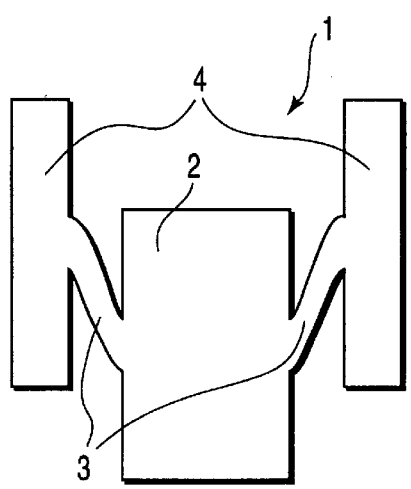
FIG. 13D is a schematic top view showing how torsion bars are deformed when a movable plate is displaced to be axially orthogonal in the conventional optical scanner shown in FIG. 12.

Each of the coil side restriction member 70 and reflection face side restriction member 71 of the restriction member 7 according to the present embodiment has a pair of orthogonal displacement restriction portion 7a and turning displacement restriction portion 7b as in the first embodiment. The optical scanner 11 further has an axially orthogonal displacement restriction portion 7c that restricts the axially orthogonal displacement in a direction orthogonal to the turning center line of the movable plate as shown in FIG. 13C. In addition, the optical scanner 11 further has an axially displacement restriction portion 7d that restricts the axial displacement in a direction along the turning center line of the movable plate as shown in FIG. 13D.

At the reflection face side restriction member 71 of the movable plate 20, an opening 71b that is a rectangular slit indicated by the broken line shown in FIG. 5 is provided between a pair of orthogonal displacement restriction portions 7a. The opening 71b has its sufficient size for performing desired optical scanning without interrupting light incident to a reflection face of the movable plate 20 and light reflected from this reflection face.

The axially orthogonal displacement restriction portion 7c, as shown in FIG. 6A, is configured to extend in a direction orthogonal to a front portion of the movable plate 20 so as to be close to each other from the coil side restriction member 70 and reflection face side restriction member 71 respectively, and to come into contact with each other. The axially orthogonal displacement restriction portion 7c has a vertical face 72 facing two sides 20a of the movable plate 20 in a direction orthogonal to the turning center line of the movable plate 20.

An interval between the face 72 and the movable plate 20 is selected in consideration of an influence caused by air flow between the movable plate 20 and the face 72. This is because, in the case where the internal is small, it affects swinging of the movable plate 20. More specifically, since the thickness of a laminar boundary layer between the face 72 and the movable plate 20 is about 0.05 mm, if the interval is smaller than about 0.05 mm, an influence caused by air viscosity appears, and an influence caused by a squeeze effect (resistance when a fluid is extruded from a small clearance) is increased. As a result, the movable plate 20 hardly swings (turns). Thus, the interval is preferably selected as 0.05 mm or more.

In addition, The axially orthogonal displacement restriction portion 7c is configured to extend in a direction orthogonal to a front portion of the movable plate 20 so as to be close to each other from the coil side restriction member 70 and reflection face side restriction member 71 may not come into contact with each other. In addition, the face 72 may not be vertical, and is not limited in shape.

The axially displacement restriction portion 7d extends from the reflection face side restriction member 71 in a direction orthogonal to a front portion of the movable plate 20, as shown in FIG. 6C. In addition, the axial displacement restriction portion 7d is disposed in a space between two sides 20b in a direction along the turning center line of the movable plate 20 and two sides facing each of the support bodies that correspond to two sides 20b. It is also required to select an interval between the axial displacement restriction potion 7d and the movable plate 20 in consideration of an influence caused by air flow as in the movable plate 20 and the face 72 of the axially orthogonal displacement restriction member 7c. That is, the thickness of a laminar boundary layer between the axially displacement restriction portion 7d and the movable plate 20 is about 0.05 mm. If the interval is smaller than this value, an influence caused by air flow appears, and an influence caused by a squeeze effect (resistance when a fluid is extruded from a small clearance) is increased. Thus, the interval is desirably 0.05 mm or more.

In addition, the axial displacement restriction portion 7d may not extend in a direction orthogonal to a surface of the movable plate 20 if the restriction portion can restrict the axial displacement of the movable plate 20, and is not limited in shape. In addition, in the present embodiment, although the axial displacement restriction portion 7d extends from the reflection face side restriction member 71, this portion can be extended from the coil side restriction member 70.

(Operation)

Here, an operation of an optical scanner 11 according to the above described second embodiment will be described here. The optical scanner 11 according to the present embodiment makes the following operation in the case where the scanner is subjected to an extreme shock due to a drop or is subjected to vibration.

First, a case in which the movable plate 20 is subjected to the orthogonal displacement as shown in FIG. 13A will be described here.

In the case of the orthogonal displacement, the movable plate 20 comes into contact with the orthogonal displacement restriction portion 7a of the reflection face side restriction member 71 positioned downwardly as schematically shown in FIG. 3A. Due to this contact, the movable plate 20 is prevented from being further displaced in a direction orthogonal to its own back portion. Thus, a stress is less than an allowable stress to a pair of torsion bars 30. Thereby the stress does not cause a permanent deformation due to expansion of the torsion bar 30. The torsion bars 30 is prevented from the deformation.

Here, a case in which the movable plate 20 is subjected to the turning displacement as shown in FIG. 13B will be described here.

In the case of the turning displacement, as shown in FIG. 3B, the movable plate 20 comes into contact with the turning displacement restriction portion 7b of the coil side restriction member 70 and reflection face side restriction member 71 so that the turning displacement of the movable plate 20 around the turning axis (torsion bars 30) does not exceed a predetermined turning range. Due to this contact, the movable plate 20 is prevented from being displaced beyond a predetermined turning range. Thus, a stress is less than an allowable stress to a pair of torsion bars 30. Thereby the stress does not cause a permanent deformation due to torsion of the torsion bar 30. The torsion bars30 is prevented from the deformation.

Here, a case in which the movable plate 20 is subjected to the inclined displacement as shown in FIG. 13C will be described here.

Figure 3C:
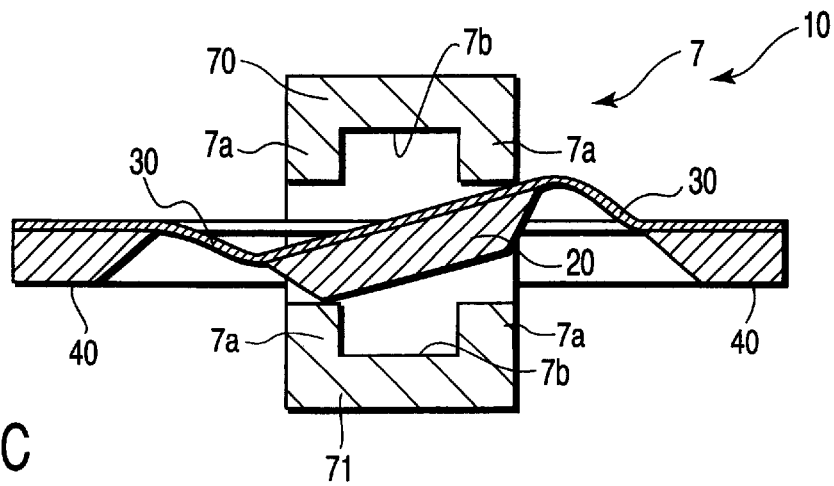
FIG. 3C is a schematic cross section view showing an operation of the restriction member when a movable plate is displaced to be inclined in the optical scanner shown in FIG. 1A.

In the case of the inclined displacement, as shown in FIG. 3C, the movable plate 20 comes into contact with the orthogonal displacement restriction portion 7a of the coil side restriction member 70 and reflection face side restriction member 71 so that the inclining its own front portion relevant to the support body 40 does not exceeds a predetermined swinging range. Due to this contact, the movable plate 20 is prevented from being further inclined relevant to the turning center line. Thus, a stress is less than an allowable stress to a pair of torsion bars 30. Thereby the stress does not cause a permanent deformation due to expansion and torsion of the torsion bar 30. The torsion bars30 is prevented from the deformation.

Here, a case in which the movable plate 20 is subjected to the axially orthogonal displacement as shown in FIG. 13D will be described here.

Figures 6D, 6E:
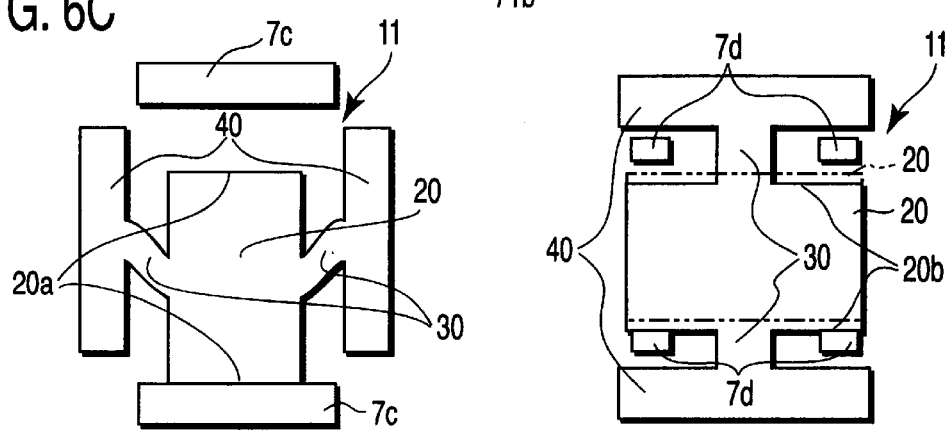
FIG. 6D is a schematic cross section view showing an operation of a restriction member when a movable plate is displaced to be axially orthogonal in the optical scanner shown in FIG. 5.
FIG. 6E is a schematic cross section view showing an operation of a restriction member when a movable plate is displaced in an axial direction in the optical scanner shown in FIG. 5.

In the case of the axially orthogonal displacement, as shown in FIG. 6D, the movable plate 20 comes into contact with one of the faces 72 of two axially displacement restriction portions 7c so that a displacement in a direction orthogonal to the turning center line along its own front portion does not exceeds a predetermined swinging range. Due to this contact, the movable plate 20 is prevented from being further displaced in an axially orthogonal direction. Thus, a stress is less than an allowable stress to a pair of torsion bars 30. Thereby the stress does not cause a permanent deformation due to expansion of the torsion bar 30. The torsion bars 30 is prevented from the deformation.

Figure 13E:
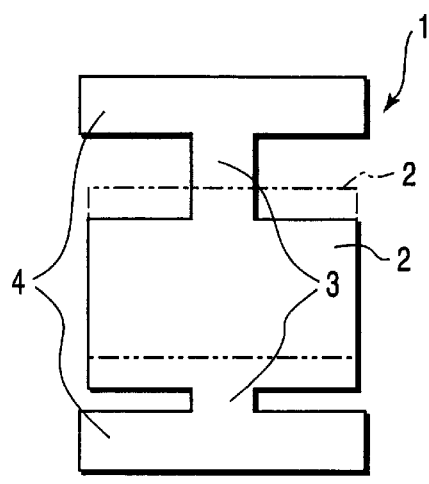
FIG. 13E is a schematic top view showing how torsion bars are deformed when a movable plate is displaced in an axial direction in the conventional optical scanner shown in FIG. 12.

Here, a case in which the movable plate 20 is subjected to the axially orthogonal displacement as shown in FIG. 13E will be described here.

In the case of the axially orthogonal displacement, as shown in FIG. 6E, the movable plate 20 comes into contact with one of the two axially orthogonal restriction portions 7d. Due to this contact, the movable plate 20 is prevented from being further displaced in an axial direction. Thus, a stress is less than an allowable stress to a pair of torsion bars 30. Thereby the stress does not cause a permanent deformation due to expansion along its own longitudinal center axis line of the torsion bar 30. The torsion bars 30 is prevented from the deformation.

In the optical scanner 10 according to the present embodiment, even in the case the displacement generates multiply, the movable plate 20 comes into contact with the restriction member 7 that corresponds to the displacement, and an occurrence of a permanent deformation with the torsion bars can be prevented.

As described above, in the optical scanner 11 according to the present embodiment, an occurrence of a permanent deformation with the torsion bars 30 due to the excessive orthogonal displacement, the turning displacement, the inclined displacement, the axially orthogonal displacement, and the axially displacement is prevented. Thus, when the optical scanner 11 is used, the optical scanner 11 causes the movable plate 20 to perform desired swinging (turning), and desired optical scanning can be performed.

(Third Embodiment)
(Configuration)

Figure 7:
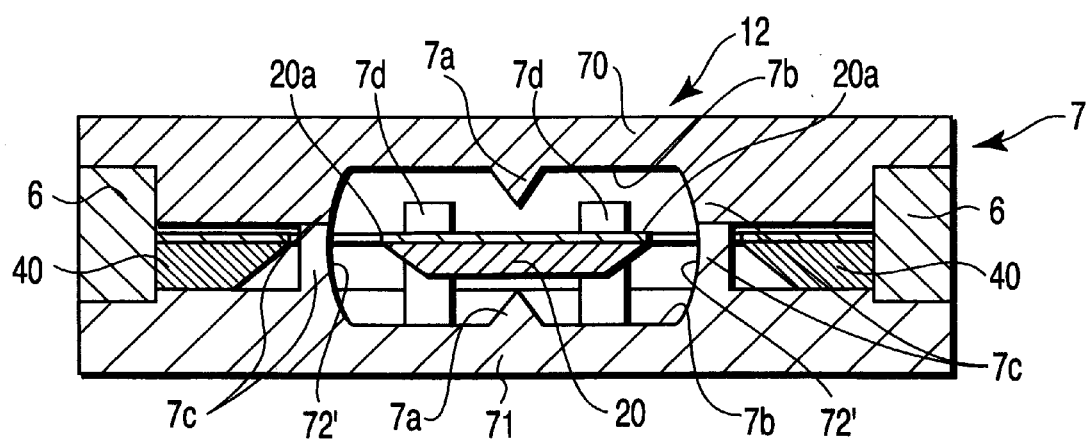
FIG. 7 is a schematic cross section of an optical scanner according to a third embodiment of the present invention.

Hereinafter, an optical scanner 12 according to a third embodiment of the present invention will be described with reference to FIG. 7. In the optical scanner 12, like constituent elements identical to those of the aforementioned optical scanner 11 according to the second embodiment of the present invention are designated by like reference numerals corresponding to those of the optical scanner 11. A detailed description will be omitted here.

The optical scanner 12 according to the third embodiment is different from the aforementioned optical scanner 11 according to the second embodiment in that a face 72' facing the side 20a of the movable plate 20 is formed on an arc shaped face in the axially orthogonal displacement restriction portion 7c. When the movable plate 20 turns around the turning center line, this arc shaped face 72' has an arc shape such that a predetermined interval can be spaced from each portion of an arc shaped trajectory depicted at an end of the movable plate 20 that extends in a direction along the turning center line. The predetermined interval is preferably 0.05 to 0.5 mm, although not limited unless desired swinging (turning) of the movable plate 20 has been prevented.

(Operation)

Now, an operation of an optical scanner 12 according to the above described third embodiment will be described here. The optical scanner 12 according to the present embodiment operates in the same manner as in the second embodiment, in the case where the movable plate 20 is subjected to the orthogonal displacement, turning displacement, inclined displacement, and axial displacement.

Here, a case in which the movable plate 20 is subjected to the axially orthogonal displacement as shown in FIG. 13D in the optical scanner 12 according to the present embodiment will be described here.

In the case of the axially orthogonal displacement, the movable plate 20 is displaced as shown in FIG. 13D. However, the movable plate 20 comes into contact with a arc shaped face 72' of the axially orthogonal displacement restriction portion 7c so that a displacement of the movable plate 20 does not exceeds a predetermined range. Thus, a stress is less than an allowable stress to a pair of torsion bars 30. Thereby the stress does not cause a permanent deformation due to expansion of the torsion bar 30. The torsion bars30 is prevented from the deformation.

In the optical scanner 12 according to the present embodiment, a face 72' is formed in an arc shape so that a distance between the face 20a of the movable plate 20 being swung and the face 72' is always constant. Thus, in the case where a synthetic displacement between the axially orthogonal displacement and the turning displacement generates with the movable plate 20, even if the above synthetic displacement generates at any synthesis ratio, the optical scanner 12 can restrict the turning displacement and axially orthogonal displacement more remarkably as compared with a case in which the face 72 is vertical as in the second embodiment.

(Fourth Embodiment)
(Configuration)

Here, an optical scanner 13 according to a forth embodiment of the present embodiment will be described with reference to FIGS. 8, 9A, and 9B. In the optical scanner 13, like constituent elements identical to those of the aforementioned optical scanner 10 according to the first embodiment of the present invention are designated by reference numerals corresponding to those of the optical scanner 10. A detailed description will be omitted here.

Figure 8:
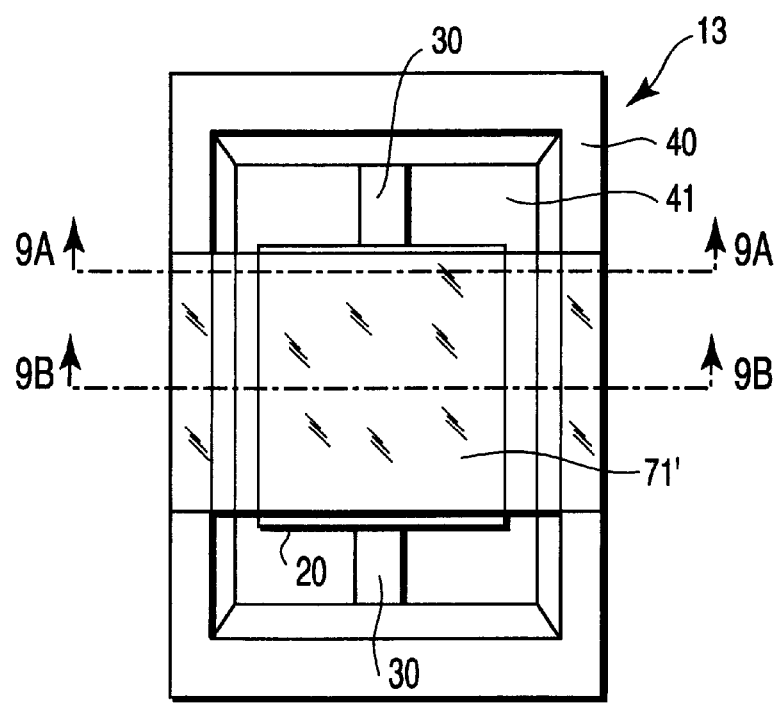
FIG. 8 is a top view of an optical scanner according to a fourth embodiment of the present invention.
Figure 9A:
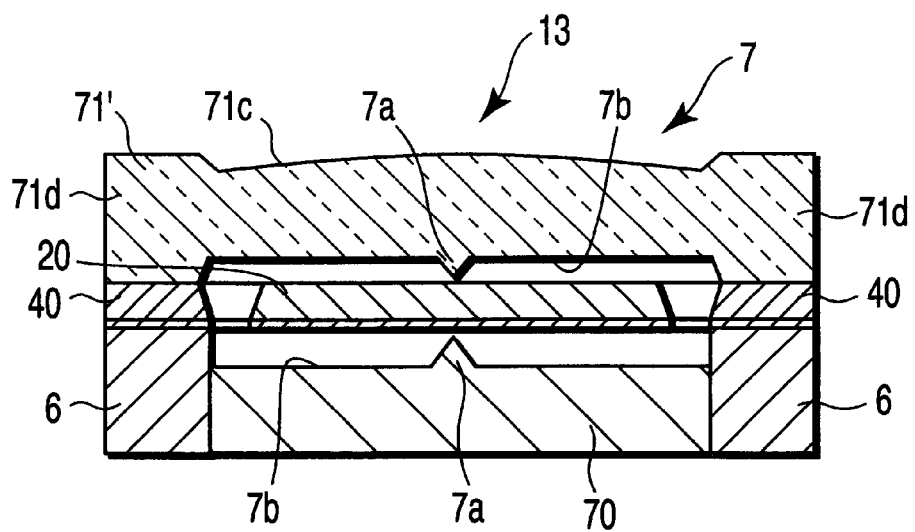
FIG. 9A is a cross section taken along the line A—A shown in FIG. 8.
Figure 9B:
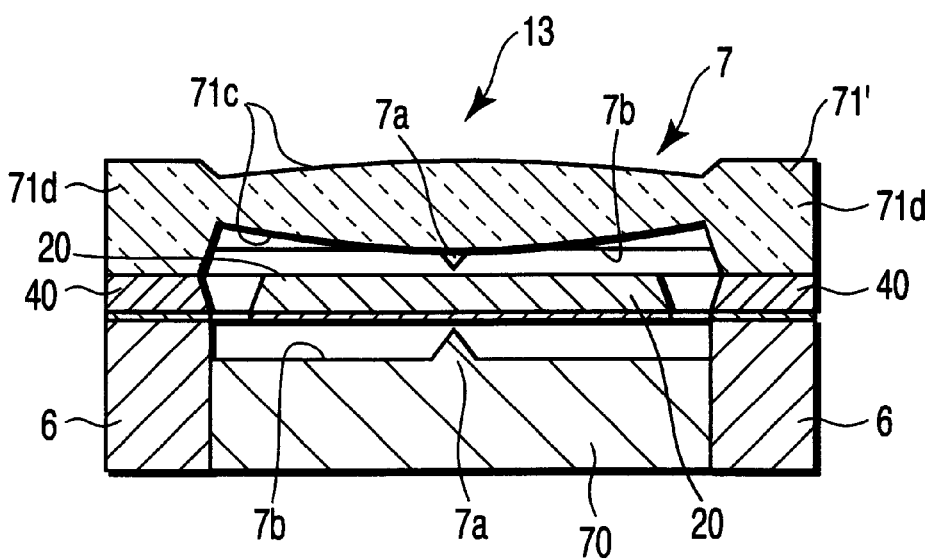
FIG. 9B is a cross section taken along the line B—B shown in FIG. 8.

FIG. 8 is a top view of an optical scanner 13 viewed from a reflection face side. FIG. 9A is a sectional view of the optical scanner 13 taken along the line A—A shown in FIG. 8. FIG. 9B is a sectional view of the optical scanner 13 taken along the line B—B shown in FIG. 8.

The optical scanner 13 according to the present embodiment is configured in the same way as the optical scanner 10 according to the first embodiment with only a difference in reflection face side restriction member 71'.

The reflection face side restriction member 71' of the optical scanner 13 according to the present embodiment does not have an opening 71a unlike the reflection face side restriction member 71 according to the first embodiment. Thus, in the optical scanner 13 according to the present embodiment, the reflection face side restriction member 71' has an optical element so that light can be incident to the reflection face of the movable plate 20. Thus, the reflection face side restriction member 71' is molded by an optical resin polymethyl acrylate (PMMA). In addition, the reflection face side restriction member 71' has two faces, i.e., a face (front portion) on which a convex curved face 71c having a light focusing action faces the movable plate 20 and a face (back portion) at the opposite side to the face (front portion).

In the reflection face side restriction member 71, a periphery portion facing the support body 40 is formed at a thick flange 71d. In the flange 71d, a portion facing the support body 40 is fixed to the support body 40. At the front portion of the reflection face side restriction member 71', an orthogonal displacement restriction portion 7a extending in a direction orthogonal to the back portion of the movable plate 20 at the neutral position is integrally formed at both ends along the turning center line of the movable plate 20. In addition, at the front portion of the reflection face side restriction member 71', a portion other than the orthogonal displacement restriction portion 7a defines a turning displacement restriction portion 7b. A turning displacement restriction portion 7b restricts a turning displacement of the movable plate 20.

(Operation)

Here, an operation of an optical scanner 13 according to the present embodiment will be described here.

In the optical scanner 13, the scattering light flux emitted from a light source (not shown) transmits the reflection face side restriction member 71' that is an optical element. Then the light flux is focused on a reflection face of the movable plate 20. Then, the focused light is reflected on the reflection face, the reflected light transmits the reflection face side restriction member 71' again, and the transmitted light is emitted. The optical scanner 13 can scan light by the movable plate 20 causing turning movement.

In the optical scanner 13 according to the present embodiment, in the case where the scanner is subjected to an extreme shock caused by a drop or is subjected to vibration, the scanner makes operation in the same way as the optical scanner 10 according to the first embodiment.

(Fifth Embodiment)

(Configuration)

Figure 10A:
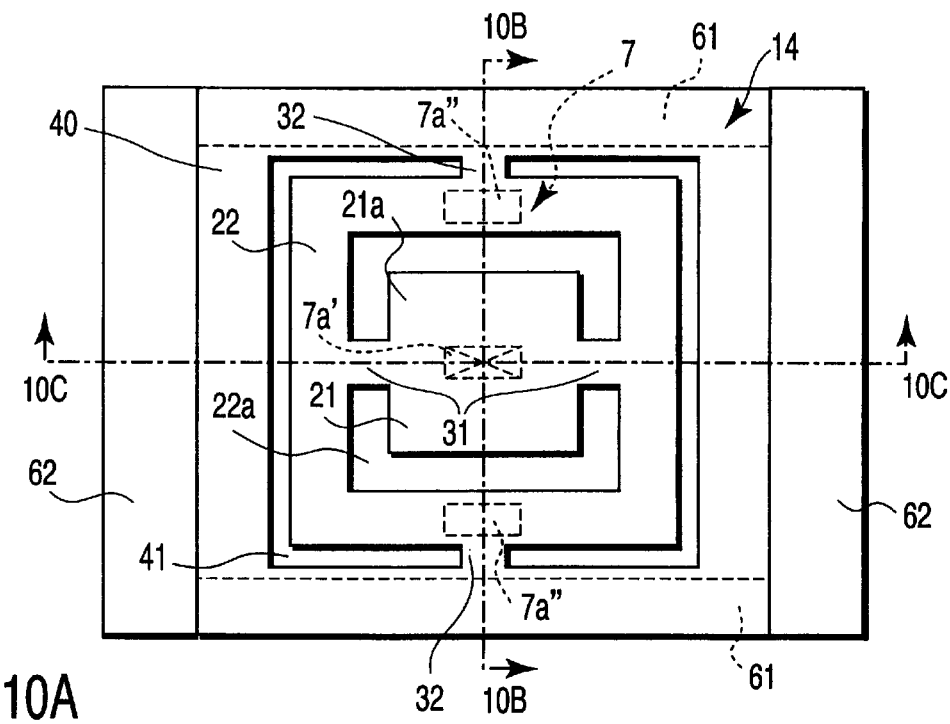
FIG. 10A is a schematic top view of an optical scanner according to a fifth embodiment of the present invention.
Figure 10B:
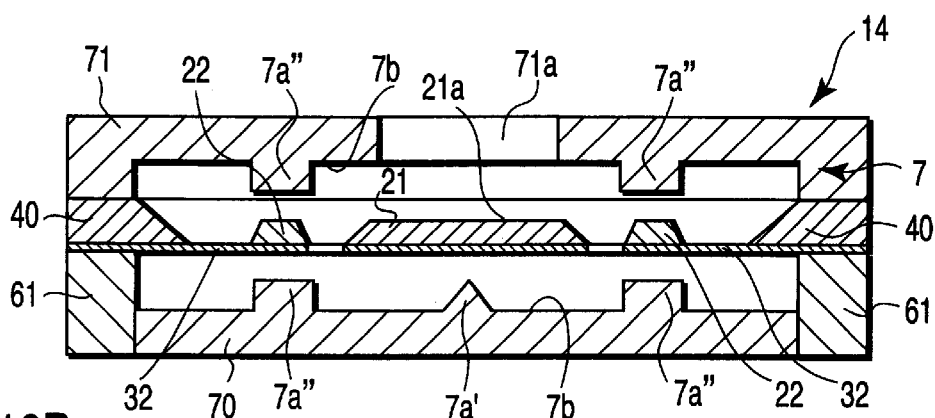
FIG. 10B is a cross section taken along the line B—B shown in FIG. 10A.
Figure 10C:
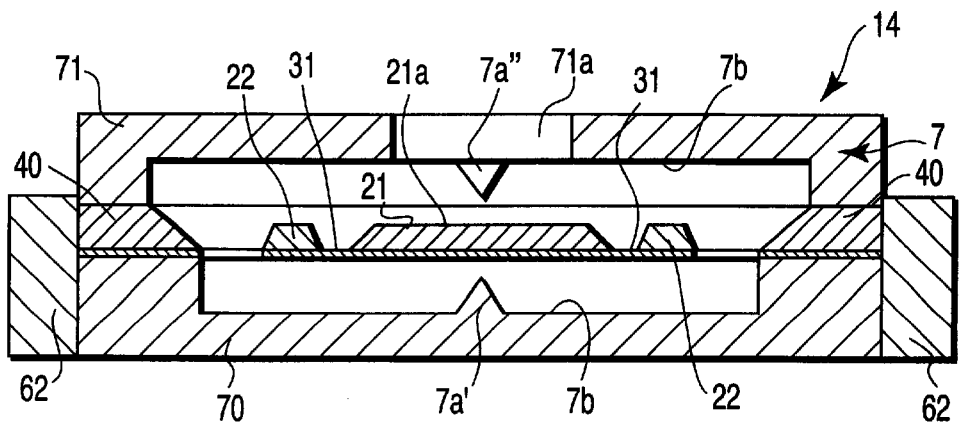
FIG. 10C is a cross section taken along the line C—C shown in FIG. 10A.

Hereinafter, an optical scanner 14 according to a fifth embodiment of the present invention will be described with reference to FIGS. 10 and 11. FIG. 10A is a schematic top view of the optical scanner 14. A reflection face side restriction member is not shown for clarity. FIG. 10B is a sectional view of the optical scanner 14 taken along the line B—B shown in FIG. 10A. FIG. 10C is a sectional view of the optical scanner 14 taken along the line C—C shown in FIG. 10A.

As shown in FIG. 10A, the optical scanner 14 according to the present embodiment has: a movable plate that comprises a first movable member 21 and a second movable member 22; a first torsion bar 31; a second torsion bar 32; a support body 40; and a restriction member 7.

As shown in FIG. 10B, the first movable member 2 has: a front portion (a lower face on a paper face) provided with a coil (not shown); and a back portion (an upper face on a paper face) that comprises a reflection face 21a.

The movable plate comprising the first movable member 21 and the second movable member 22 is positioned at the neutral position in a stop state. The neutral position is as described in the prior art. In the present embodiment, the neutral position denotes a state in which the first and second movable members 21 and 22 are disposed by a pair of first and second torsion bars 31 and 32. In the neutral position, the front portions of the first and second movable members 21 and 22 and the front portion of the support body 40 (a face at the same side as the front portion of the movable plate 20) are disposed on the same plane. At this neutral position, the front portions of a pair of first and second torsion bars 31 and 32 (face at the same side as the front portions of the first and second movable members 21 and 22) are also disposed on the same plane as the front portions of the first and second movable members 21 and 22, and the support body 40. At this neutral position, the mutual longitudinal center axis lines of a pair of first torsion bars 31 are maintained so that these axis lines coincident with each other. Similarly, the mutual longitudinal center axis lines of a pair of second torsion bars 32 are maintained so that these axis lines coincide with each other.

The first movable member 21 is formed in a substantial square plate shape having its predetermined thickness. A coil of the first movable member 21 is disposed along the outer periphery of the front portion. Both ends of the coil are pulled out onto the support body 40 via either or both of a pair of first torsion bars and either or both of a pair of second torsion bars, and a pair of first power supply pads (not shown) is configured. The reflection face is made of a metal such as gold or a well-known material for reflecting other light.

The shape of the first movable portion 21 may be formed in other shape such as circular or any other rectangular shape if the movable portion enables swinging and desired optical scanning.

The second movable member 22 has: a front portion provided with a coil (not shown); and a back portion that is a face at the opposite side of the front portion. The second movable member 22 is formed in a frame shape having an opening 22a. This opening 22a is formed in size capable of housing with a predetermined interval. A coil of the second movable member is disposed along the outer periphery of the front portion. Both ends of the coil is pulled out onto the support body 40 via either or both of a pair of second torsion bars 32, and a pair of second power supply pads (not shown) is configured on the support body 40.

A pair of first torsion bars 31 has elastic members, and is configured in a plate shape. A pair of torsion bars 31 is connected to the front portion of the first movable member 22 at one end, and is connected to the second movable member 22 at the other end. At this time, a pair of first torsion bars 31 is disposed so that the mutual longitudinal center axis lines coincide with each other. With the above configuration, a pair of first torsion bars 31 is connected to the second movable member 22 so as to swing (turn) the first movable member 21. Although a pair of first torsion bars 31 is not limited in disposition as long as these bars are connected to the second movable member 22 so as to swing (turn) the first movable member 21, the bars are preferably disposed so that its own longitudinal center axis line passes through the geometrical center of the front portion of the first movable member. The first torsion bars 31 each are employed as a turning axis when the first movable member 21 swings. Thus, the longitudinal center axis lines of the first torsion bars 31 coincide with the turning center line of the first movable member 21.

A pair of second torsion bars 32 has elastic members, and is configured in a plate shape. A pair of second torsion bars 32 is connected to the front portion of the second movable member 22 at one end, and is connected to the front portion of the support member 40 (a face at the same side as the front portion of the first movable member 21) at the other end. At this time, a pair of second torsion bars 32 is disposed so that the mutual longitudinal center axis lines coincide with each other, and extends in a direction orthogonal to the longitudinal center axis lines of the first torsion bars. With the above configuration, a pair of second torsion bars 32 is connected to the support member 40 so as to swing (turn) the second movable member 22. Although the second torsion bars 32 are not limited in disposition as long as the bars each are connected to the support body 40 so as to swing (turn) the second movable member 22, the bars are preferably disposed so that its own longitudinal center axis line passes through the geometrical center of the front portion of the second movable member. Further preferably, the pair of second torsion bars 32 is disposed so that its own longitudinal center axis line passes through the geometrical center of the front portion of the first movable member 21. The second torsion bars 32 are employed as a turning axis when the second movable member 22 swings. Thus, the longitudinal center axis lines of the second torsion bars 32 coincide with the turning center line of the second movable member 22.

The support body 40 is formed in a frame shape having an opening 41 capable of housing with a predetermined interval. In addition, the support body 40 has a front portion and a back portion. The support body 40 is linked with an edge of the opening 41 at the other end of a pair of second torsion bars 30 connected as described previously. With the above configuration, the support body 40 supports the second movable member 22 so as to swing around a pair of second torsion bars 32 in the opening 41.

In addition, the support body 40 has a pair of permanent magnets 61 and 62. A pair of permanent magnets 61 is fixed to the front portion of the support body 40, and is disposed so as to face each other by sandwiching the opening 41 between these magnets. A pair of permanent magnets 61 extends in a direction along the longitudinal center axis lines of a pair of first torsion bars 31. A pair of permanent magnets 62 is disposed at an end of the support body 40 so as to face each other by sandwiching the opening 41 between these magnets. A pair of permanent magnets 62 extends in a direction along the longitudinal center axis lines of a pair of second torsion bars 32.

Although a pair of permanent magnets 61 is disposed as described previously, the magnets are not limited in disposition as long as the magnets can swing the first movable member 21 in cooperation with a coil of the first movable member 21. Similarly, although a pair of permanent magnets 62 is disposed as described previously, the magnets are not limited in disposition as long as the magnets can swing the second movable member 22 in cooperation with a coil of the second movable member 22. Similarly, each of the coils is not limited in disposition as long as each coil can swing the first and second movable members 21 and 22 in cooperation with each of the permanent magnets.

In the present embodiment, as described above, a pair of permanent magnets 61 is disposed so as to face each other in a direction along the turning center line of the second movable member 22. A pair of permanent magnets 62 is disposed so as to face each other in a direction along the turning center line of the second movable member 21. A pair of permanent magnets 61 is disposed to be more proximal to a pair of permanent magnets 62 relevant to the first movable member 21. However, although the dispositions of the first and second permanent magnets are not limited if a desired driving force is imparted to the first and second movable members 21 and 22, one permanent magnet in cooperation with each coil is preferably disposed to be more proximal to the cooperating coil than the other permanent magnet (a permanent magnet that does not work in coordination with the coil). In the present embodiment, this fact proves that a pair of permanent magnets 61 in cooperation with the coil for the first movable member 21 is preferably disposed more proximal to the above coil than the other pair of permanent magnets 62 that do not work in cooperation with the coil.

Although the first and second movable members 21 and 22, the first and second torsion bars 31 and 32, and the support body 40 are integrally formed by utilizing a semiconductor manufacturing process, a torsion swinging body is formed, if the first movable member 21 can cause desired swinging, it is possible that the first and second movable members 21 and 22, the first and second torsion bars 31 and 32, and the support body 40 are separately configured, and the torsion swinging body is formed by well-known bonding means such as adhesive.

In the present embodiment, as has been described above, although the polyimide film is coated on each of the constituent elements through which each of the coils provided at the first and second movable members passes, i.e., on the surfaces of the first and second movable members 21 and 22, the first and second torsion bars 31 and 32, and the support body 40, another insulation film may be coated as long as desired insulation effect is achieved.

With the torsion swinging body configured as described above, the first movable member 21 can be turned in a turning direction in which the first torsion bar 31 is defined as a turning axis relevant to the support body 40 and in a turning direction in which the second torsion bar 32 is defined as a turning axis, the turning direction being a direction orthogonal to the turning direction via the second movable member 22. That is, the first movable member 21 can turn in a two-dimensional manner.

The restriction member 7 has a coils side restriction member 70 and a reflection face side restriction member 71.

The coil side restriction member 70 is molded by a polyacetal resin, and is provided at a front portion of the support body 40. This coil side restriction member 70 is formed in a substantially rectangular shape, as shown in FIG. 10B. The coil side restriction member 70 has a back portion facing the first and second movable members 21 and 22 (an upper face on a paper face) and a front portion that is a face at the opposite side of the back portion (a lower face on a paper face).

In the coil side restriction member 70, a pair of permanent magnets 62 is fixed at both ends in a direction along a turning axis of the second movable member 21 (longitudinal center axis lines of the first torsion bar 31). In addition, the coil side restriction member 70 is also fixed to the support body 40 at its own back portion.

In the coil side restriction member 70, a pair of permanent magnets 61 is fixed onto both end faces in a direction along a turning axis (second torsion bar 32) of the second movable member 22. The coil side restriction member 70 is also fixed to the support body 40 via the pair of permanent magnets 61. In the coil side restriction member 70, two pairs of permanent magnets 61 and 62 are fixed onto two pairs of both end faces, as described above, thereby making it easy to determine relative positions of two pairs of permanent magnets 61 and 62 relevant to the coil.

At a back portion of the coil side restriction member 70, a first orthogonal displacement restriction portion 7a' that is a protrusion that protrudes toward the first movable member 21 is provided at a cross point between the turning center line of the first movable member 21 and the turning center line of the second movable member 22. In other words, at the back portion of the coil side restriction member 70, a first orthogonal displacement restriction portion 7a' that is a protrusion that protrudes toward the first movable member is provided at a cross point between the longitudinal center axis lines of the first and second torsion bars. The first orthogonal displacement restriction member 7a' is configured in a tapered shape (edge shape) toward its apex (tip end).

In addition, in the back portion of the coil side restriction member 70, at a portion facing the front portion of the second movable member 22, a pair of second orthogonal displacement restriction portions 7a" being a protrusion that protrudes toward the second movable member 22 is provided along the longitudinal center axis lines of the second torsion bars 32. In the back portion of the coil side restriction member 70, a portion other than the first and second orthogonal displacement restriction portions 7a' and 7a" defines a turning displacement restriction portion 7b.

The reflection face side restriction member 71 is formed in a bridge shape. This member has: a front portion facing the first and second movable members 21 and 22 (a lower face on a paper face) and a back portion that is a face at the opposite side of the front portion (an upper face on a paper face). In addition, the reflection face side restriction member 71 is fixed to the back portion of the support body 40. The reflection face side restriction member 71 is formed in a square shape, and has an opening 71a at its center. The opening 71a has its sufficient size so as not to interrupt light incident to the reflection face 21a of the first movable member 21 when the optical scanner 14 performs optical scanning and so as to perform desired scanning with the reflection light on the reflection face 21a.

With respect to a front portion of the reflection face side restriction member 71, at a position facing a back portion of the second movable member 22, a pair of second orthogonal displacement restriction portions 7a" is provided along the longitudinal center axis lines of the second torsion bars 32. The pair of second orthogonal displacement restriction portions 7a" protrudes respectively toward the second movable member 22.

In addition, at the front portion of the reflection face side restriction member 71, a portion other than the second orthogonal displacement restriction portion 7a" defines a turning displacement restriction portion 7b.

The first orthogonal displacement restriction member 7a', second orthogonal displacement restriction portion 7a", and turning displacement restriction portion 7b have a predetermined interval between the first and second movable members 21 and 22 so as not to prevent desired swinging (turning) of the first and second movable members 21 and 22.

An interval between an apex of the first and second orthogonal displacement members 21 and 22 and each of the corresponding first and second movable members 21 and 22 is preferably greater than 0 mm, and is equal to or smaller than 0.2 mm, although not limited unless desired swinging (turning) of the first and second movable members 21 and 22 is prevented. A minimum value of the interval must be greater than 0 mm. This is because an interval of 0 mm denotes that the first and second orthogonal displacement restriction portions 7a' and 7a" come into contact with each of the corresponding first and second movable members 21 and 22, and a frictional resistance prevents smooth movement of the first and second movable members 21 and 22.

In addition, an interval between the turning displacement restriction portion 7b and each of the first and second movable members 21 and 22 is preferably 0.5 mm, although not limited unless desired swinging of the first and second movable members 21 and 22 is prevented.

Further, the first orthogonal displacement restriction member 7a' is configured in a tapered shape toward its apex (tip end). Thus, as has been described with respect to the orthogonal displacement restriction member according to the first embodiment, the optical scanner 14 according to the present embodiment can reduce the interval more remarkably than a case in which its tip end is configured in a planer shape, and displacements of the first and second movable members 21 and 22 can be restricted to the required minimum. Similarly, a tip end of the second orthogonal displacement restriction portion 7a" can be configured in an edge shape along the longitudinal center axis lines of the second torsion bars 32, as has been described with respect to the orthogonal displacement restriction member according to the second embodiment. With the above configuration, the optical scanner 14 according to the present embodiment can reduce the interval more remarkably than a case in which the tip end is configured in a planer shape, and displacements of the first and second movable members 21 and 22 can be restricted to the required minimum.

A maximum value of an interval between each of the first and second movable members 21 and 22 and each of the first and second orthogonal displacement restriction portions 7a' and 7a" and the turning displacement restriction portion 7b is not limited if the displacement can be prevented before the stress in the first and second torsion bars 31 and 32 that generates as a result of an elastic deformation of each of the first and second torsion bars 31 and 32 exceeds an allowable stress.

(Operation)

Here, an operation of an optical scanner 14 according to the above described fifth embodiment will be described here.

In the optical scanner 14, when a driving current is supplied from the aforementioned power supply pad (not shown) to the coil (not shown) for the first movable member 21, an electromagnetic force of which the above current is a Lorentz force is generated in a magnetic field formed by a pair of permanent magnets 61 that is permanent magnet closer to the first movable member 21. Due to this electromagnetic force, the first movable member 21 performs swinging (turning) with a pair of first torsion bars 31 being a turning axis. This swinging (turning) is generated by the above electromagnetic force acting as a so called couple that works in an opposite direction in a place equal in distance from the turning center line of the first movable member 21. In addition, in the optical scanner 14, when a driving current is supplied from the aforementioned power supply pad (not shown) to a coil of the second movable member 22, the above current generates an electromagnetic force that is a Lorentz force in a magnetic field formed by a pair of permanent magnets 62 that is permanent magnet distant from the first movable member 21. Due to this electromagnetic force, the second movable member 22 performs swinging (turning) with a pair of second torsion bars 32 being a turning axis. This swinging (turning) is generated by the electromagnetic force acting as a couple that works in an opposite direction in a place equal in distance from the turning center line of the second movable member 22. Due to the swinging of this second movable member 22, the first movable member 21 swings as well. Therefore, the first movable member causes turning (two-dimensional swinging) in two turning directions.

In the optical scanner 14, when an alternating current with its frequency coincident with a specific resonance frequency determined depending on a torsion rigidity of the first torsion bars 31 and an moment of inertial of the first movable member 21 is supplied to a coil for the first movable member 21, the first movable member 21 swings (turns) around the turning center line most efficiently.

In addition, when an alternating current with its frequency coincident with a specific resonance frequency determined depending on a torsion rigidity of the second torsion bars 32 and an moment of inertial of the first movable member 22 is supplied to a coil for the second movable member 22, the second movable member 22 swings (turns) around the turning center line most efficiently.

The optical scanner 14 causes light to be externally incident to the reflection face 21a and the incident light to be reflected, thereby scanning the light. The optical scanner 14 is capable of scanning light in a two-dimensional manner by swinging (turning) the first and second movable members 21 and 22.

The optical scanner according to the present embodiment makes the following operation in the case where the scanner is subjected to an extreme shock caused by a drop or is subjected to vibration.

First, a description will be given with respect to a case in which the first and second movable members 21 and 22 are subjected to the orthogonal displacement that is a displacement in a direction orthogonal to its own front portion as shown in FIG. 13A.

Figure 11A:
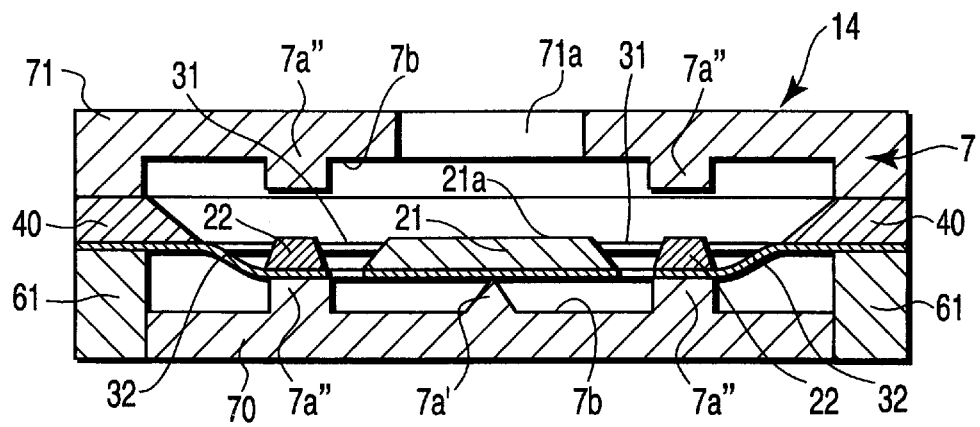
FIG. 11A is a schematic cross section view showing an operation of a restriction member when a drop in a first direction is carried out in the optical scanner shown in FIG. 10A.

In the case where the first and second movable members 21 and 22 are subjected to the orthogonal displacement, the first and second movable members 21 and 22, as shown in FIG. 11A, come into contact with the first and second orthogonal displacement restriction portions 7a' and 7a" of the coil side restriction member 70 of the restriction member 7 or come into contact with the second orthogonal displacement restriction portion 7a" of the reflection face side restriction member 71. Due to this contact, the first and second movable members 21 and 22 can be prevented from being further displaced in the orthogonal direction, and an occurrence of a stress equal to or greater than an allowable stress with the first and second torsion bars 31 and 32 can be prevented. Thus, an occurrence of a permanent deformation with the first and second torsion bars 31 and 32 due to expansion is prevented.

In addition, a first orthogonal displacement restriction portion 7a' of the coil side restriction member 70, as shown in the above configuration, is disposed to be opposed to a cross point of the longitudinal center axis lines of the first and second torsion bars 31,32. The point does not substantially move during this swinging (turning), and is generally coincident with the geometrical center of the first and second movable members. Thereby the point is irrespective point of a two-dimensional swinging (turning) of the first movable member 21. Thus, the first orthogonal displacement restriction portion 7a' does not impede predetermined two-dimensional swinging of the first movable member 21.

Here, a description will be given with respect to a case in which the first movable member 21 is subjected to the turning displacement with the first torsion bar 31 (refer to FIG. 13B'), and concurrently, the second movable member 22 is subjected to an inclined displacement (refer to FIG. 13C') such that its own front portion is inclined relevant to a front portion of the support body 40 on a vertical cross section through which the second torsion bar 32 passes.

When the first movable member 21 is subjected to the turning displacement, as shown in FIG. 13B, the movable member comes into contact with at least one of the turning displacement restriction portions 7b of the reflection face side restriction member 71 and coil side restriction member 70 so that the movable member does not exceed a predetermined movable range.

Figure 11B:
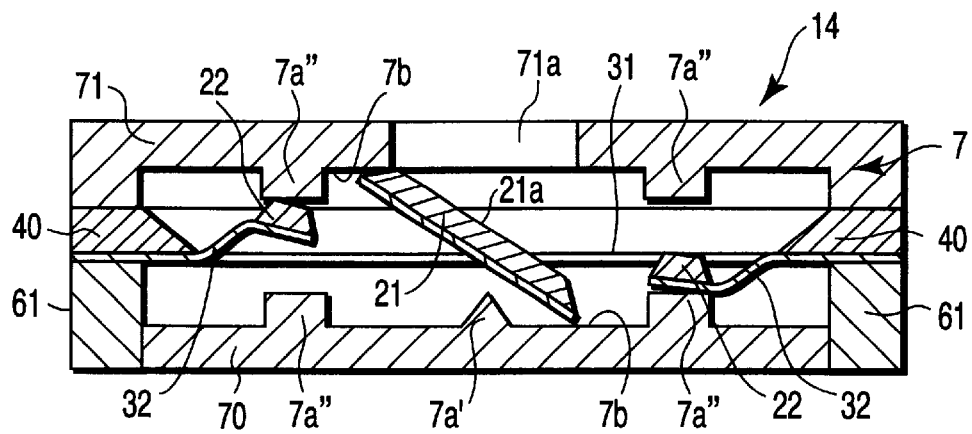
FIG. 11B is a schematic cross section view showing a restriction member when a drop in an unmatched state second direction is carried out while a first torsion bars are horizontally disposed in the optical scanner shown in FIG. 10A.

When the second movable member 22 is subjected to the inclined displacement, as shown in FIG. 11B, the movable member comes into contact with the second orthogonal displacement restriction portion 7a" so that the movable member does not exceed a predetermined turning range.

Due to these contacts, at the first and second movable members 21 and 22, a displacement is restricted so that these members do not exceed a predetermined turning range and a predetermined inclined range. As a result, a stress is less than an allowable stress to first and second torsion bars 31 and 32, and an occurrence of a permanent deformation of the first and second torsion bars 31 and 32 due to their torsion or expansion is prevented.

Here, a description will be given with respect to a case in which the second movable member 22 is subjected to the turning displaced (refer to FIG. 13B') with the second torsion bar 32 being a turning axis, and concurrently, the first movable member 21 is subjected to an inclined displacement (refer to FIG. 13C') such that its own front portion is inclined relevant to a front portion of the support body 40 on a vertical cross section through which the first torsion bar 31 passes.

Figure 11C:
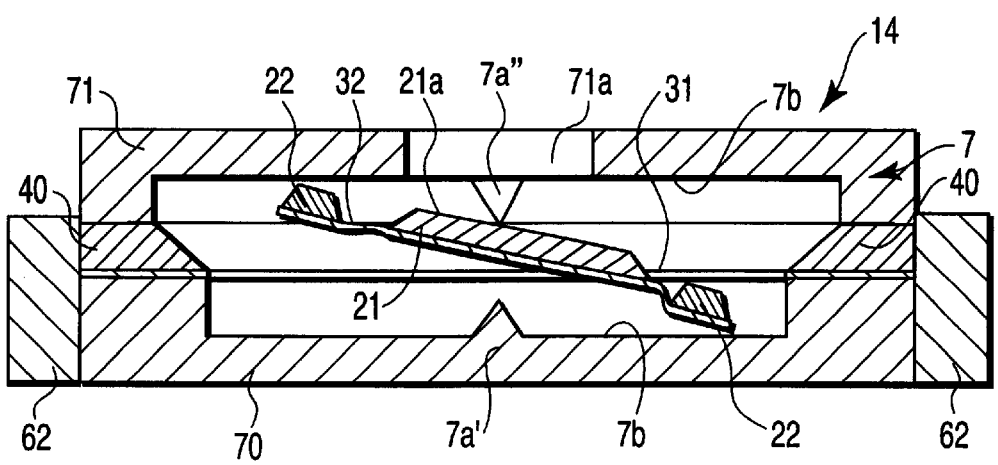
FIG. 11C is a schematic cross section view showing a restriction member when a drop in an unmatched state third direction is carried out while a second torsion bars are horizontally disposed in the optical scanner shown in FIG. 10A.
Figure 12:
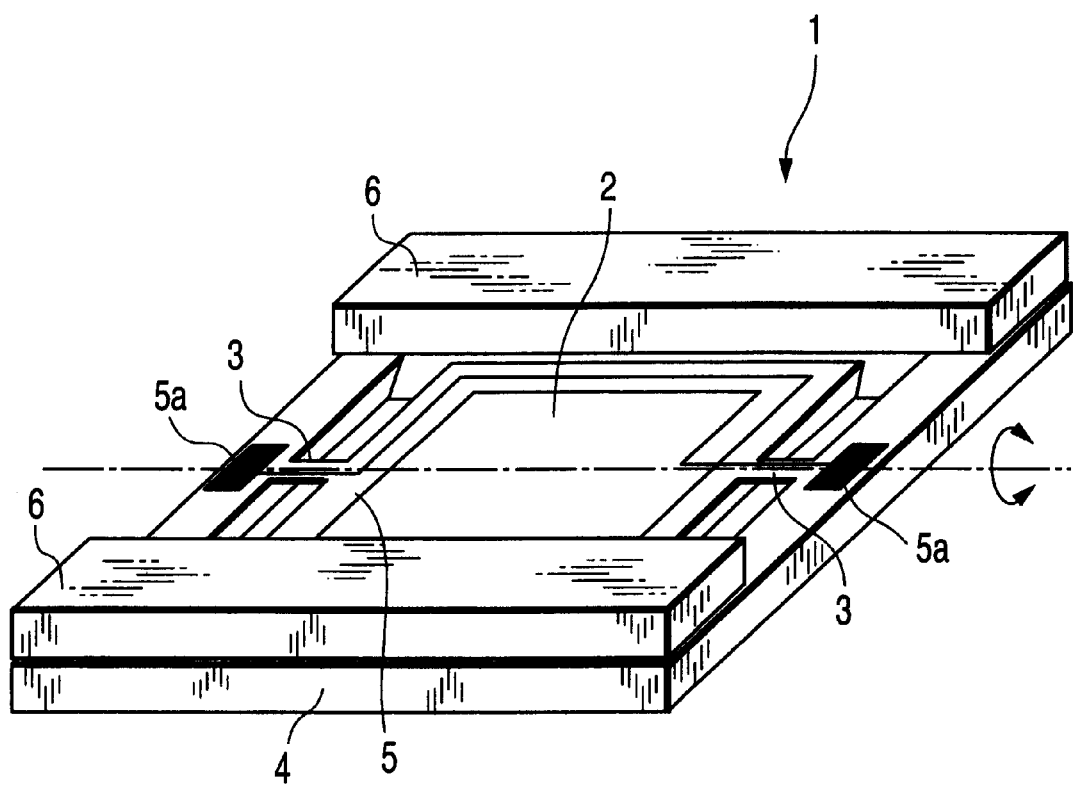
FIG. 12 is a perspective view showing a conventional optical scanner.

When the second movable member 22 is subjected to the turning displacement, as shown in FIG. 11C, the movable member comes into contact with at least one of the turning displacement restriction portions 7b of the reflection face side restriction member 71 and the coil side restriction member 70 so that the movable member does not exceed a predetermined turning range.

Due to this contact, a displacement is restricted so that the first and second movable members 21 and 22 do not exceed a predetermined turning range and a predetermined inclined range. Thus, a stress is less than an allowable stress to the first and second torsion bars 31 and 32, and an occurrence of a permanent deformation of the first and second torsion bars 31 and 32 due to their torsion or expansion is prevented.

In the optical scanner 14 according to the present embodiment, even in the case where a displacement due to a drop (orthogonal displacement, turning displacement, and inclined displacement) generates multiply, the movable plate comes into contact with the restriction member 7 that corresponds to the displacement. Thus, an occurrence of a permanent deformation with the torsion bars 31,32 can be prevented.

As has been described above, the first and second torsion bars 31 and 32 are prevented from being permanently deformed. Thus, even after the optical scanner 14 has dropped, the scanner causes the first and second movable members 21 and 22 to perform desired swinging (turning), and desired optical scanning can be performed by means of the scanner 14.

In the optical scanner according to the present invention, although the restriction member that restricts a displacement of a movable plate is molded by a polyacetal or polymethyl acrylate (PMMA), the restriction member may be formed of other material or structure as long as the member is a viscous elastic body or may be molded by other plastic molding material such as polycarbonate. In addition, the restriction member may be formed of a metal base material such as aluminum die cast instead of a plastic molder or may be coated with an organic polymer on its surface.

Although the optical scanner according to the present invention has been described by way of exemplifying a shock caused by a drop, it is a matter of course that, in the case where a movable plate is displaced due to a factor other than a drop, the restriction member 7 acts so as to prevent excessive displacement.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical scanner comprising:

a movable plate having a coil and a reflection face, the movable plate being positioned at a neutral position in a stop state;

torsion bars connected to the movable plate;

a support body turnably supporting the movable plate by the torsion bars; and a restriction member disposed at a position spaced with a predetermined distance from a surface of the movable plate, the restriction member coming into physical contact with the movable plate when a shock is applied to the optical scanner, thereby restricting a displacement of the movable plate equal to or greater than a predetermined quantity, wherein the movable plate is turned with the torsion bars being a turning axis, and the restriction member has a tip end that comes into contact with a movable plate, the tip end being edge shaped.

2. An optical scanner according to claim 1, wherein a surface of the movable plate has a front portion that comprises the coil and a back portion that comprises the reflection face, and the restriction member faces at least one of the front portion and the back portion of the movable plate at the neutral position, is provided at a position spaced with a predetermined distance along a direction orthogonal to said at least one of the front portion and the back portion, and restricts a displacement of the movable plate along the direction.

3. An optical scanner according to claim 1, wherein the movable plate has a first movable member and a second movable member;

the first movable member and second movable member have a front portion that comprises the coil and a back portion at the opposite side of the front portion on a surface;

the first movable member has a reflection face on the back portion;

the second movable member has an opening capable of housing the first movable member, the first movable member being disposed in the opening;

the torsion bars have a first torsion bars and a second torsion bars;

the first torsion bars connect the first movable member to the second movable member, are configured as a turning axis of the first movable member, and turnably support the first movable member;

the second torsion bars are disposed in a direction being parallel to the front portion or the back portion and being orthogonal to the first torsion bars, connect the second movable member to the support body, are configured as a turning axis of the second movable member, and turnably support the second movable member; and the restriction member faces at least one of the front portion and the back portion of the first movable member at the neutral position, is provided at a position at which turning axes of the first and second movable members cross each other, and which is spaced with a predetermined distance in a direction orthogonal to said at least one of the front portion and the back portion, so that the restriction member restricts a displacement of the first movable member in the direction.

4. An optical scanner according to claim 1, wherein the movable plate has a first movable member and a second movable member;

the first movable member and second movable member have a front portion that comprises the coil and a back portion at the opposite side of the front portion on a surface;

the first movable member has a reflection face at the back portion;

the second movable member has an opening capable of housing the first movable member, the first movable member being disposed in the opening;

the torsion bars have a first torsion bars and a second torsion bars;

the first torsion bars connect the first movable member to the second movable member, are configured as a turning axis of the first movable member, and turnably support the first movable member;

the second torsion bars are disposed in a direction being parallel to the front portion or the back portion and being orthogonal to the first torsion bars, connect the second movable member to the support body, are configured as a turning axis of the second movable member, and turnably support the second movable member; and the restriction member faces at least one of the front portion and the back portion of the second movable member at the neutral position, and is provided at a position which passes a turning axis of the second movable member and which is spaced with a predetermined distance from the at least one of the front portion and the back portion in a direction orthogonal to at least one of the front portion and the back portion, the restriction member restricting a displacement of the second movable member in the direction.

5. An optical scanner comprising:

a movable plate having a coil and a reflection face, the movable plate being positioned at a neutral position in a stop state;

torsion bars connected to the movable plate;

a support body turnably supporting the movable plate by the torsion bars; and a restriction member disposed at a position spaced with a predetermined distance from a surface of the movable plate, the restriction member coming into physical contact with the movable plate when a shock is applied to the optical scanner, thereby restricting a displacement of the movable plate equal to or greater than a predetermined quantity, wherein the movable plate is turned with the torsion bars being a turning axis, a surface of the movable plate has a front portion that comprises the coil and a back portion that comprises the reflection face, and the restriction member faces at least one of the front portion and the back portion of the movable plate at the neutral position, is provided at a position spaced with a predetermined distance along a direction orthogonal to said at least one of the front portion and the back portion, so that restriction member restricts a displacement around a turning axis of the movable plate.

6. An optical scanner comprising:
a movable plate having a coil and a reflection face, the movable plate being positioned at a neutral position in a stop state;
torsion bars connected to the movable plate;
a support body turnably supporting the movable plate by the torsion bars; and
a restriction member disposed at a position spaced with a predetermined distance from a surface of the movable plate, the restriction member coming into physical contact with the movable plate when a shock is applied to the optical scanner, thereby restricting a displacement of the movable plate equal to or greater than a predetermined quantity,
wherein the movable plate is turned with the torsion bars being a turning axis, a surface of the movable plate has a front portion that comprises the coil and a back portion that comprises the reflection face, the movable plate has two end located in a direction being orthogonal to the turning axis and being parallel to at least one of the front portion and the back portion of the movable plate at the neutral position, and the restriction member is provided at a position spaced with a predetermined distance from at least one of the end, so that the restriction member restricts a displacement of the movable plate in the direction.

7. An optical scanner comprising:
a movable plate having a coil and a reflection face, the movable plate being positioned at a neutral position in a stop state;
torsion bars connected to the movable plate;
a support body turnably supporting the movable plate by the torsion bars; and
a restriction member disposed at a position spaced with a predetermined distance from a surface of the movable plate, the restriction member coming into physical contact with the movable plate when a shock is applied to the optical scanner, thereby restricting a displacement of the movable plate equal to or greater than a predetermined quantity,
wherein the movable plate is turned with the torsion bars being a turning axis, a surface of the movable plate has a front portion that comprises the coil and a back portion that comprises the reflection face, and the restriction member is provided at a position spaced with a predetermined distance in a direction along the turning axis from at least one of a two ends, of the movable plate, located in the direction, so that the restriction member restricts a displacement in the direction.

8. An optical scanner comprising:
a movable plate having a coil and a reflection face, the movable plate being positioned at a neutral position in a stop state;
torsion bars connected to the movable plate;
a support body turnably supporting the movable plate by the torsion bars; and
a restriction member disposed at a position spaced with a predetermined distance from a surface of the movable plate, the restriction member coming into physical contact with the movable plate when a shock is applied to the optical scanner, thereby restricting a displacement of the movable plate equal to or greater than a predetermined quantity,
wherein the movable plate is turned with the torsion bars being a turning axis, a surface of the movable plate has a front portion that comprises the coil and a back portion that comprises the reflection face, and the restriction member comprises:
a turning restriction portion facing at least one of the front portion and the back portion of the movable plate at the neutral position, the turning restriction portion being provided at a position spaced with a predetermined distance along a direction orthogonal to said at least one of the front portion and the back portion, so that the turning restriction portion restricts a displacement of the movable plate around the turning axis; and
a vertical displacement restriction portion facing at least one of the front portion and the back portion of the movable plate at the neutral position, the vertical displacement restriction portion being provided at a position spaced with a predetermined distance along a direction orthogonal to at least one of the front portion and the back portion, so that the vertical displacement restriction portion restricts a displacement of the movable plate along the direction.

9. An optical scanner comprising:
a movable plate having a coil and a reflection face, the movable plate being positioned at a neutral position in a stop state;
torsion bars connected to the movable plate;
a support body turnably supporting the movable plate by the torsion bars; and
a restriction member disposed at a position spaced with a predetermined distance from a surface of the movable plate, the restriction member coming into physical contact with the movable plate when a shock is applied to the optical scanner, thereby restricting a displacement of the movable plate equal to or greater than a predetermined quantity,
wherein the movable plate is turned with the torsion bars being a turning axis, and
wherein the movable plate has a first movable member and a second movable member;
the first movable member and second movable member have a front portion that comprises the coil and a back portion at the opposite side of the front portion on a surface;
the first movable member has a reflection face on the back portion;
the second movable member has an opening capable of housing the first movable member, the first movable member being disposed in the opening;
the torsion bars have a first torsion bars and a second torsion bars;
the first torsion bars connect the first movable member to the second movable member, are configured as a turning axis of the first movable member, and turnably support the first movable member;
the second torsion bars are disposed in a direction being parallel to the front portion or the back portion and being orthogonal to the first torsion bars, connect the second movable member to the support body, are configured as a turning axis of the second movable member, and turnably support the second movable member; and
the restriction member is provided at a position spaced with a predetermined distance in a direction orthogonal to at least one of the front portion and the back portion from said at least one of the front portion and the back portion of at least one of the first and second movable members at the neutral position, so that the restriction member restricts a displacement around a turning axis of at least one of the first and second movable members.

10. An optical scanner comprising:

a movable plate having a coil and a reflection face, the movable plate being positioned at a neutral position in a stop state;

torsion bars connected to the movable plate;

a support body turnably supporting the movable plate by the torsion bars; and a restriction member disposed at a position spaced with a predetermined distance from a surface of the movable plate, the restriction member coming into physical contact with the movable plate when a shock is applied to the optical scanner, thereby restricting a displacement of the movable plate equal to or greater than a predetermined quantity, wherein the movable plate is turned with the torsion bars being a turning axis, and wherein the movable plate has a first movable member and a second movable member;

the first movable member and second movable member have a front portion that comprises the coil and a back portion at the opposite side of the front portion on a surface;

the first movable member has a reflection face on the back portion;

the second movable member has an opening capable of housing the first movable member, the first movable member being disposed in the opening;

the torsion bars have a first torsion bars and a second torsion bars;

the first torsion bars connect the first movable member to the second movable member, are configured as a turning axis of the first movable member, and turnably support the first movable member;

the second torsion bars are disposed in a direction being parallel to the front portion or the back portion and being orthogonal to the first torsion bars, connect the second movable member to the support body, are configured as a turning axis of the second movable member, and turnably support the second movable member; and the restriction member faces at least one of the front portion and the back portion of the first movable member at the neutral position, is provided at a position at which turning axes of the first and second movable members cross each other, and which is spaced with a predetermined distance in a direction orthogonal to said at least one of the front portion and the back portion, so that the restriction member restricts a displacement of the first movable member in the direction.

11. An optical scanner comprising:

a movable plate having a coil and a reflection face, the movable plate being positioned at a neutral position in a stop state;

torsion bars connected to the movable plate;

a support body turnably supporting the movable plate by the torsion bars; and a restriction member disposed at a position spaced with a predetermined distance from a surface of the movable plate, the restriction member coming into physical contact with the movable plate when a shock is applied to the optical scanner, thereby restricting a displacement of the movable plate equal to or greater than a predetermined quantity, wherein the movable plate is turned with the torsion bars being a turning axis, and wherein the movable plate has a first movable member and a second movable member;

the first movable member and second movable member have a front portion that comprises the coil and a back portion at the opposite side of the front portion on a surface;

the first movable member has a reflection face at the back portion;

the second movable member has an opening capable of housing the first movable member, the first movable member being disposed in the opening;

the torsion bars have a first torsion bars and a second torsion bars;

the first torsion bars connect the first movable member to the second movable member, are configured as a turning axis of the first movable member, and turnably support the first movable member;

the second torsion bars are disposed in a direction being parallel to the front portion or the back portion and being orthogonal to the first torsion bars, connect the second movable member to the support body, are configured as a turning axis of the second movable member, and turnably support the second movable member; and the restriction member faces at least one of the front portion and the back portion of the second movable member at the neutral position, and is provided at a position which passes a turning axis of the second movable member and which is spaced with a predetermined distance from the at least one of the front portion and the back portion in a direction orthogonal to at least one of the front portion and the back portion, the restriction member restricting a displacement of the second movable member in the direction.

12. An optical scanner comprising:

a movable plate having a coil and a reflection face, the movable plate being positioned at a neutral position in a stop state;

torsion bars connected to the movable plate;

a support body turnably supporting the movable plate by the torsion bars; and a restriction member disposed at a position spaced with a predetermined distance from a surface of the movable plate, the restriction member coming into physical contact with the movable plate when a shock is applied to the optical scanner, thereby restricting a displacement of the movable plate equal to or greater than a predetermined quantity, wherein the movable plate is turned with the torsion bars being a turning axis, and wherein the movable plate has a first movable member and a second movable member;

the first movable member and second movable member have a front portion that comprises the coil and a back portion at the opposite side of the front portion on a surface;

the first movable member has a reflection face at the back portion;

the second movable member has an opening capable of housing the first movable member, the first movable member being disposed in the opening;

the torsion bars have a first torsion bars and a second torsion bars;

the first torsion bars connect the first movable member to the second movable member, are configured as a turning axis of the first movable member, and turnably support the first movable member;

the second torsion bars are disposed in a direction parallel to the front portion or the back portion and in a direction orthogonal to the first torsion bars, connect the second movable member to the support body, are configured as a turning axis of the second movable member, and turnably support the second movable member; and the restriction member comprises:

a turning restriction portion provided at a position spaced with a predetermined distance in a direction orthogonal to at least one of the front portion and the back portion from at least one of the front portion and the back portion of at least one of the first and second movable members at the neutral position, the turning restriction portion restricting a displacement around a turning axis of at least one of the first and second movable members;

a first vertical displacement restriction portion facing at least one of the front portion and the back portion of the first movable member at the neutral position, the first vertical displacement restriction portion passing through a point at which turning axes of the first and second movable members cross each other, the first vertical displacement restriction member being provided at a position spaced with a predetermined distance in a direction orthogonal to at least one of the front portion and the back portion, the first vertical displacement restriction member restricting a displacement of the first movable member in a direction orthogonal to at least one of the front portion and the back portion; and a second vertical displacement restriction portion facing at least one of the front portion and the back portion of the second movable member at the neutral position, the second vertical displacement portion being provided at a position spaced with a predetermined distance in a direction orthogonal to at least one of the front portion and the back portion, the second vertical displacement portion restricting a displacement of the second movable member in a direction orthogonal to at least one of the front portion and the back portion.

\* \* \* \* \*